(12) United States Patent
Funato et al.

(10) Patent No.: US 9,843,340 B2
(45) Date of Patent: Dec. 12, 2017

(54) SEMICONDUCTOR DEVICE

(71) Applicant: Renesas Electronics Corporation, Koutou-ku, Tokyo (JP)

(72) Inventors: Yoshihiro Funato, Tokyo (JP); Yasuo Morimoto, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 0 days.

(21) Appl. No.: 15/390,606

(22) Filed: Dec. 26, 2016

(65) Prior Publication Data
US 2017/0257112 A1 Sep. 7, 2017

(30) Foreign Application Priority Data

Mar. 7, 2016 (JP) .................................. 2016-043276

(51) Int. Cl.
*H03M 1/12* (2006.01)
*H03M 1/46* (2006.01)
*H03M 1/06* (2006.01)

(52) U.S. Cl.
CPC ............. *H03M 1/466* (2013.01); *H03M 1/06* (2013.01)

(58) Field of Classification Search
CPC ...... H03M 1/468; H03M 1/0678; H03M 1/46; H03M 1/12; H03M 1/0675; H03M 1/144; H03M 1/466; H03M 1/687; H03M 1/38; H03M 1/804; H03M 1/00
USPC ........................................ 341/150, 155, 172
See application file for complete search history.

(56) References Cited

U.S. PATENT DOCUMENTS

| | | | | |
|---|---|---|---|---|
| 9,496,888 B1* | 11/2016 | Sharma | .................... | H03M 1/38 |
| 9,559,716 B1* | 1/2017 | Matsui | ..................... | H03M 1/46 |
| 2010/0123611 A1 | 5/2010 | Cho et al. | | |
| 2011/0227774 A1* | 9/2011 | Cho | ..................... | H03M 1/0678 341/172 |
| 2012/0133541 A1* | 5/2012 | Schmatz | ............... | H03M 1/462 341/172 |

(Continued)

FOREIGN PATENT DOCUMENTS

JP 2014-011768 A 1/2014

OTHER PUBLICATIONS

C.C.Liu, "A 10b 100 message store/s 1.13 mW SAR ADC with binary-scaled error compensation", ISSCC, 2010.

(Continued)

*Primary Examiner* — Linh Nguyen
(74) *Attorney, Agent, or Firm* — Shapiro, Gabor and Rosenberger, PLLC

(57) ABSTRACT

A semiconductor device according to the present invention has a capacitance DAC (Digital-to-Analog Converter) circuit and a comparator.

The capacitance DAC circuit includes: first capacitors to which input signals are given and each of which has a capacitance value corresponding to a weight of a bit to be converted; and second capacitors to which common voltages are given and whose sum of capacitance values is equivalent to that of the first capacitors. Further, the second capacitors include: a redundant bit capacitor having a capacitance value corresponding to a weight of a redundant bit; and adjustment capacitors each having a capacitance value obtained by subtracting the capacitance value of the redundant bit capacitor from the sum of the capacitance values of the second capacitors.

12 Claims, 19 Drawing Sheets

(56) References Cited

U.S. PATENT DOCUMENTS

| | | | | |
|---|---|---|---|---|
| 2012/0280841 A1* | 11/2012 | Wang | ................... | H03M 1/1295 |
| | | | | 341/110 |
| 2012/0280846 A1* | 11/2012 | Lin | ....................... | H03M 1/002 |
| | | | | 341/172 |
| 2012/0326901 A1* | 12/2012 | Zhao | ................... | H03M 1/0604 |
| | | | | 341/118 |
| 2013/0044014 A1* | 2/2013 | Lin | ..................... | H03M 1/1061 |
| | | | | 341/110 |
| 2013/0088375 A1* | 4/2013 | Wu | ..................... | H03M 1/1047 |
| | | | | 341/120 |
| 2015/0180498 A1* | 6/2015 | Yang | ..................... | H03M 1/403 |
| | | | | 341/120 |
| 2015/0263756 A1* | 9/2015 | Chiu | ..................... | H03M 1/468 |
| | | | | 341/118 |
| 2015/0318862 A1* | 11/2015 | Feddeler | ................. | H03M 1/46 |
| | | | | 341/155 |

OTHER PUBLICATIONS

Extended European Search Report dated Aug. 3, 2017, in European Application No. 17159283.5.

\* cited by examiner

FIRST EXAMPLE OF SEMICONDUCTOR DEVICE

SECOND EXAMPLE OF SEMICONDUCTOR DEVICE

WHEN PROCESSING IS PERFORMED PROPERLY WITHOUT ERROR

Cout: L L H H L H

CONVERSION RESULT = 7 (=16×0 + 8×0 + 4×1 + {2×1 + (−2)×0} + 2×0 + 1×1)

WHEN ERROR OCCURS IN SECOND CONVERSION

Cout: L H L L L H

OCCURRENCE OF CONVERSION ERROR  CORRECTION OF CONVERSION ERROR

CONVERSION RESULT = 7 (=16×0 + 8×1 + 4×0 + {2×0 + (−2)×1} + 2×0 + 1×1)

OCCURRENCE OF CONVERSION ERROR  CORRECTION OF CONVERSION ERROR

SEMICONDUCTOR DEVICE

CROSS-REFERENCE TO RELATED APPLICATIONS

The disclosure of Japanese Patent Application No. 2016-043276 filed on Mar. 7, 2016 including the specification, drawings and abstract is incorporated herein by reference in its entirety.

BACKGROUND

The present invention relates to a semiconductor device and, for example, to a semiconductor device including an analog-to-digital conversion circuit.

In a semiconductor device, in order to perform processing about an analog signal in a digital circuit, the analog-to-digital conversion circuit which converts an analogue value of the analog signal into a digital value is used. One type of the analog-to-digital conversion circuit is a successive comparison type analog-to-digital conversion circuit. In the successive comparison type analog-to-digital conversion circuit, there is a case where a redundant comparison operation is performed to correct misjudgment caused by various noises and settling error.

Accordingly, Non-patent Document 1 discloses an example of the analog-to-digital conversion circuit which performs a redundant comparison operation. As to the analog-to-digital conversion circuit of Non-patent Document 1, an input signal is given as a difference signal, and a comparator and two wirings by which the difference signal is delivered to the comparator are provided. In this regard, in the analog-to-digital conversion circuit of Non-patent Document 1, some capacitors have capacitance which corresponds to the same weight etc., and a redundant compare treatment is performed using one of the electrostatic capacitor of this same capacitance variation. Then, by performing this redundant comparison processing, the analog-to-digital conversion circuit of N-patent Document 1 corrects an incorrect judgment.

Non-Patent Document

[Non-patent Document 1] C. C. Liu, "A 10b 100 message store/s 1.13 mW SAR ADC with binary-scaled error compensation", ISSCC, 2010

SUMMARY

As to the analog-to-digital conversion circuit, although there is one type where a differential signal is used as an input signal, not a few types use single-end signals as input signals. However, it is difficult to adopt, as it is, a circuit configuration for performing the redundant comparison in the analog-to-digital conversion circuit of a type disclosed in Non-patent Document 1 where the differential signal is used as an input signal to an analog-to-digital conversion circuit using the single-end signal as an input signal (hereafter, referred to as a "single-end type analog-to-digital conversion circuit").

To be specific, in the single-end type analog-to-digital conversion circuit, a capacitor to which weighting corresponding to a bit to be converted is given is performed only to one end of the wirings to be coupled to the input terminal of the comparator (for example, a wiring to be coupled to an inverted input terminal of the comparator). Therefore, when performing correction operation according to redundant comparison in the single-end type analog-to-digital conversion circuit, in order to achieve negative weighting for the correction, a conversion result of a normal comparison operation before the redundant comparison must be changed. Thus, when changing a determined conversion result, it is necessary to perform calculation for changing the determined conversion result backwardly or to change the conversion result with use of a table for changing the conversion result.

With use of either method described above, such change in the conversion result requires a circuit, which provides a big delay, in a successive comparison resistor logic in the analog-to-digital conversion circuit. Consequently, the above requirement largely affects convergence time of the input signal to the comparator during the comparison operation. That is, when using, as it is, the configuration for the redundant comparison based on the differential input-type analog-to-digital conversion circuit disclosed in Non-patent Document 1, there arises a problem of decrease in conversion rate in the single-end type analog-to-digital conversion circuit.

The other problems to be solved and novel features will become apparent from the following description and the attached drawings.

According to one embodiment, a semiconductor device includes: a capacitance DAC (Digital-to-Analog Converter) circuit; and a comparator which changes the logic level of an output signal based on the relative size relationship of two signals outputted from the capacitance DAC (Digital-to-Analog Converter) circuit. The capacitance DAC circuit includes: a first comparison wiring coupled with a plurality of first capacitors to which input signals are given and each of which has a capacitance value corresponding to a weight of a bit to be converted; and a second comparison wiring coupled with a plurality of second capacitors to which common voltages are given and whose sum of capacitance values is equivalent to that of the first capacitors. Further, the second capacitors include: a redundancy bit capacitor having a capacitance value corresponding to a weight of a redundancy bit; and an adjustment capacitor having a capacitance value obtained by subtracting the capacitance value of the redundant bit capacitor from the sum of the capacitance values of the second capacitors.

According to Embodiment 1 described above, the semiconductor device can perform the conversion operation including a redundant comparison at a higher speed.

BRIEF DESCRIPTION OF THE DRAWINGS

In the following, some descriptions and drawings are omitted or simplified as appropriate to clarify the explanation. Moreover, in each of the drawings, identical or corresponding parts are designated by the same reference characters, and the description thereof is not repeated as required.

Embodiment 1

Figure 1:
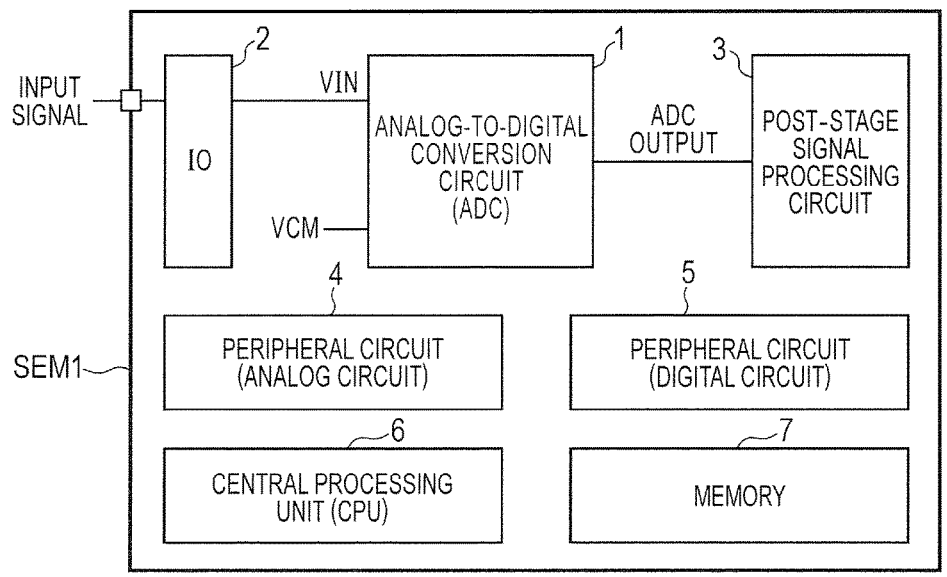
FIG. 1 is a block diagram showing a semiconductor device according to Embodiment 1.
Figure 1:
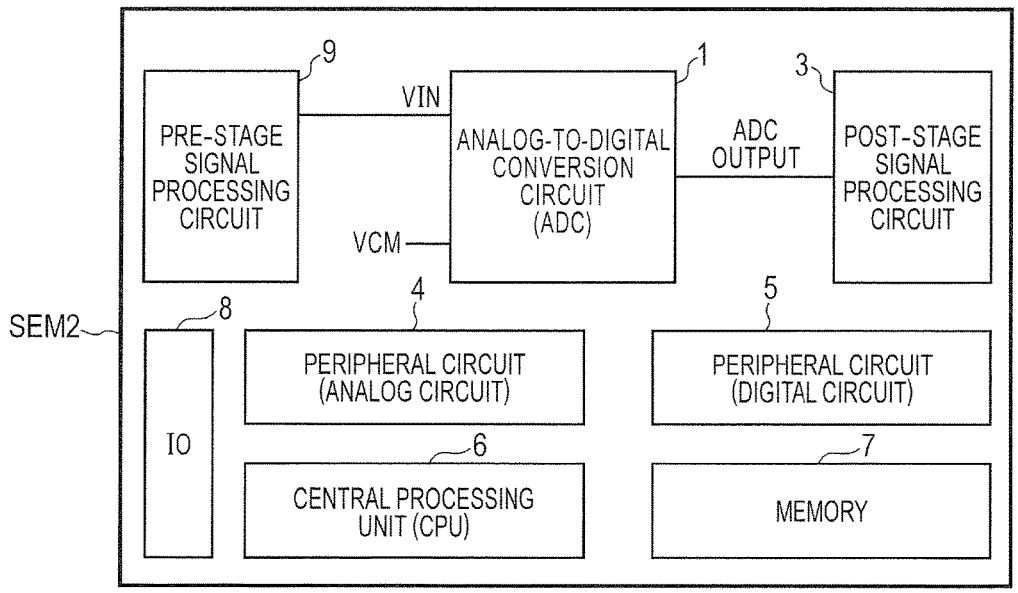

First, a semiconductor device according to Embodiment 1 will be explained. FIG. 1 shows a block diagram of the semiconductor device according to Embodiment 1. In FIG. 1, examples of two semiconductor devices are shown. In a first example of the semiconductor device shown in FIG. 1, the semiconductor device includes: an analog-to-digital conversion circuit (ADC) 1; an input/output interface (IO) 2; a post-stage signal processing circuit 3; a peripheral circuit 4; a peripheral circuit 5; a central processing unit (CPU) 6; and a memory 7. Moreover, in a second example, in place of the input/output interface 2 of the first example, the semiconductor device includes an input/output interface (IO) 8 and a pre-stage signal processing circuit 9.

The analog-to-digital conversion circuit (ADC) 1 converts a voltage level of an input signal VIN of an analog signal into a digital value and outputs it as an ADC output. The input/output interfaces 2 and 8 take input signals given from the outside into the semiconductor device. Moreover, the input/output interfaces 2 and 8 output signals generated in the semiconductor device. The post-stage signal processing circuit 3 is, for example, a circuit which performs signal processing such as filter processing to the ADC output. The peripheral circuit 4 includes an analog circuit among the peripheral circuits used by the CPU 6 and the peripheral circuits controlled by the CPU 6. The peripheral circuit 4 may be an operational amplifier, a reference voltage generation part, a common voltage generation part, or an oscillation circuit. Among the peripheral circuits 5 used by the CPU 6 and the peripheral circuits controlled by the CPU 6, the peripheral circuit 5 includes a digital circuit. The peripheral circuit 5 may be, for example, a circuit such as a coprocessor, a timer, etc. The CPU 6 executes, for example, a program stored in the memory 7. Moreover, the CPU 6 controls the peripheral circuits 4 and 5 with use of a calculation result and, at the same time, performs calculation with use of a result obtained by the processing of the peripheral circuit 5. The memory 7 holds, for example, the program and data used in the CPU 6. The pre-stage signal processing circuit 9 performs pre-processing of the input signal VIN given to the analog-to-digital conversion circuit 1. The pre-processing may be amplification of the analog signal.

Figure 2:
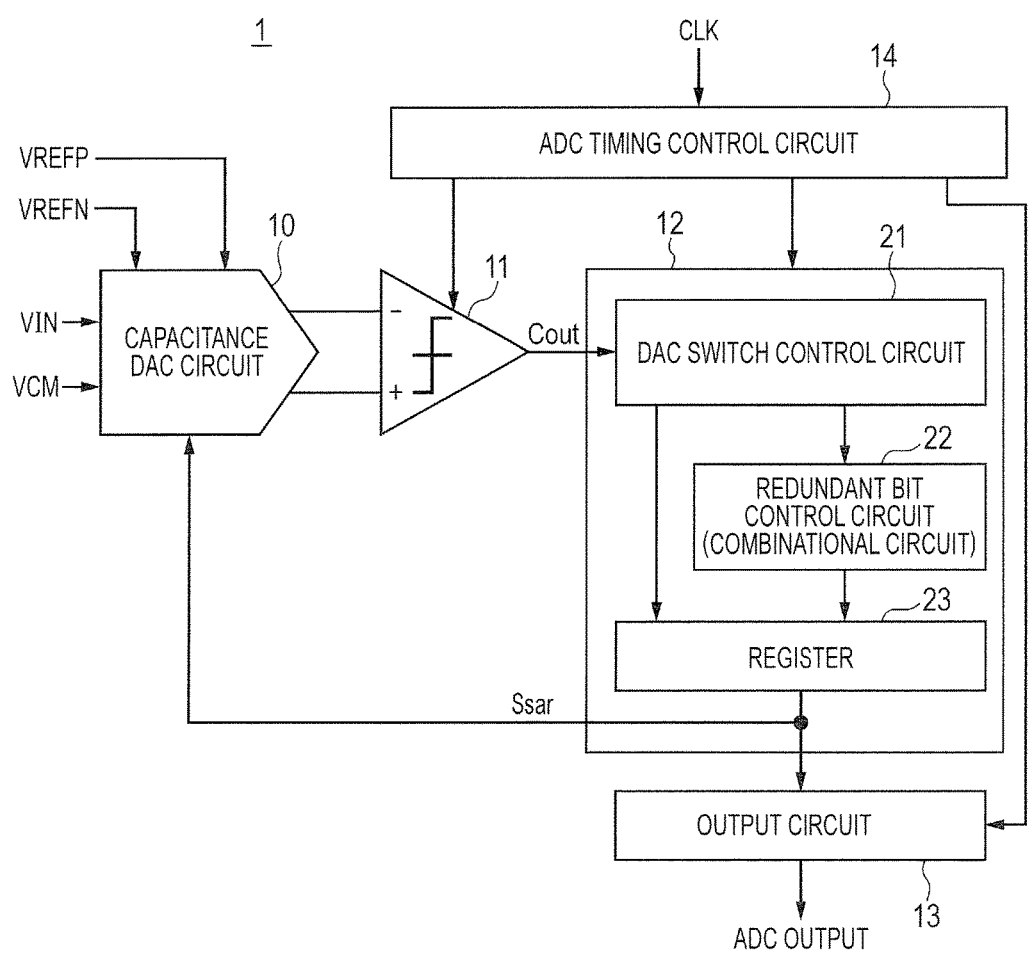
FIG. 2 is a block diagram showing an analog-to-digital conversion circuit according to Embodiment 1.

The semiconductor device according to Embodiment 1 has one of its characteristics in the analog-to-digital conversion circuit 1. Hereafter, the analog-to-digital conversion circuit 1 will be explained in detail. FIG. 2 shows a block diagram of the analog-to-digital conversion circuit 1 according to Embodiment 1.

As shown in FIG. 2, the analog-to-digital conversion circuit 1 according to Embodiment 1 includes: a capacitance DAC (Digital-to-Analog Converter) circuit 10; a comparator 11; a successive comparison register logic 12; an output circuit 13; and the ADC timing control circuit 14. Based on a comparison result outputted by the comparator 11, the analog-to-digital conversion circuit 1 determines a digital value (for example, a switch control signal Ssar) to be given to the capacitance DAC circuit 10 on a bit-by-bit basis from a highest-order bit to a lowest-order-bit and repeats the comparison operation so as to produce a pre-conversion result. At this time, in the analog-to-digital conversion circuit, a value of a redundant bit is included in the pre-conversion result. Therefore, in the analog-to-digital conversion circuit 1, a value shown by the pre-conversion result including the redundant bit is calculated with use of the output circuit 13 and the ADC output being a final output value of the analog-to-digital conversion circuit 1 is obtained.

The capacitance DAC circuit 10 samples the input signal VIN and the common voltage VCM. Then, based on a digital value shown by a switch control signal Ssar outputted by the successive comparison register logic 12, the capacitance DAC 10 shifts voltage levels of the sampled input signal VIN and the common voltage VCM having shift amounts corresponding to the switch control signal Ssar. Further, based on a digital value shown by a switch control signal Ssar outputted by the successive comparison register logic 12, the capacitance DAC circuit 10 shifts voltage levels of the sampled input signal VIN and the common voltage VCM having shift amounts corresponding to the switch control signal Ssar. In the example shown in FIG. 2, the capacitance DAC circuit 10 gives a conversion value of the input signal VIN to an inversion input terminal of a comparator and gives a conversion value of a common voltage VCM to a non-inverted input terminal.

Based on the relative size relationship of the voltage levels to be inputted to the two input terminals, the comparator 11 switches a logic level of the output signal (for example, the comparison result Cout). The successive comparison register logic 12 generates the pre-conversion result of the analog-to-digital-conversion circuit 1 including the value of a redundant bit. The successive comparison resistor logic 12 includes a DAC switch control circuit 21, a redundant bit control circuit 22, and a register 23. Based on the number of comparison operations of analog-to-digital conversion circuit 1 and the comparison result outputted by the comparator 11, the DAC switch control circuit 21 updates a bit value of the switch control signal Ssar for switch control of the capacitance DAC circuit 10. The redundant bit control circuit 22 changes, among the bit values of the switch control signal Ssar updated by the DAC switch control circuit 21, a bit value corresponding to a redundant bit. This redundant bit control circuit 22 is comprised of combinational circuits. The details of the redundant bit control circuit 22 will be described later. The resistor 23 holds the value of the switch control signal Ssar determined by the DAC switch control circuit 21 and the redundant bit controlling circuit 22.

Based on the pre-conversion result being the switch control signal Ssar including the redundant bit when the comparison is completed, the output circuit 13 computes a digital value to be outputted and generates an ADC output to be a final output value of the analog-to-digital conversion circuit 1. When a redundant bit is 1 bit and a value of "n" bit is outputted as an ADC output, the analog-to-digital conversion circuit 1 outputs a value of (n+1) as the pre-conversion result. Therefore, the output circuit 13 outputs the ADC output of n bit by computing the value of n bit from the value of (n+1). The ADC timing control circuit 14 outputs, from a clock signal CLK, a timing signal instructing an operational timing to the comparator 11, the successive comparison register logic 12, and the output circuit 13. Upon receiving the timing signal, the comparator 11, the successive comparison register logic 12, and the output circuit 13 perform switching of the sampling operation and the comparison operation, or determine the output timing of the ADC output in response to a timing signal.

Figure 3:
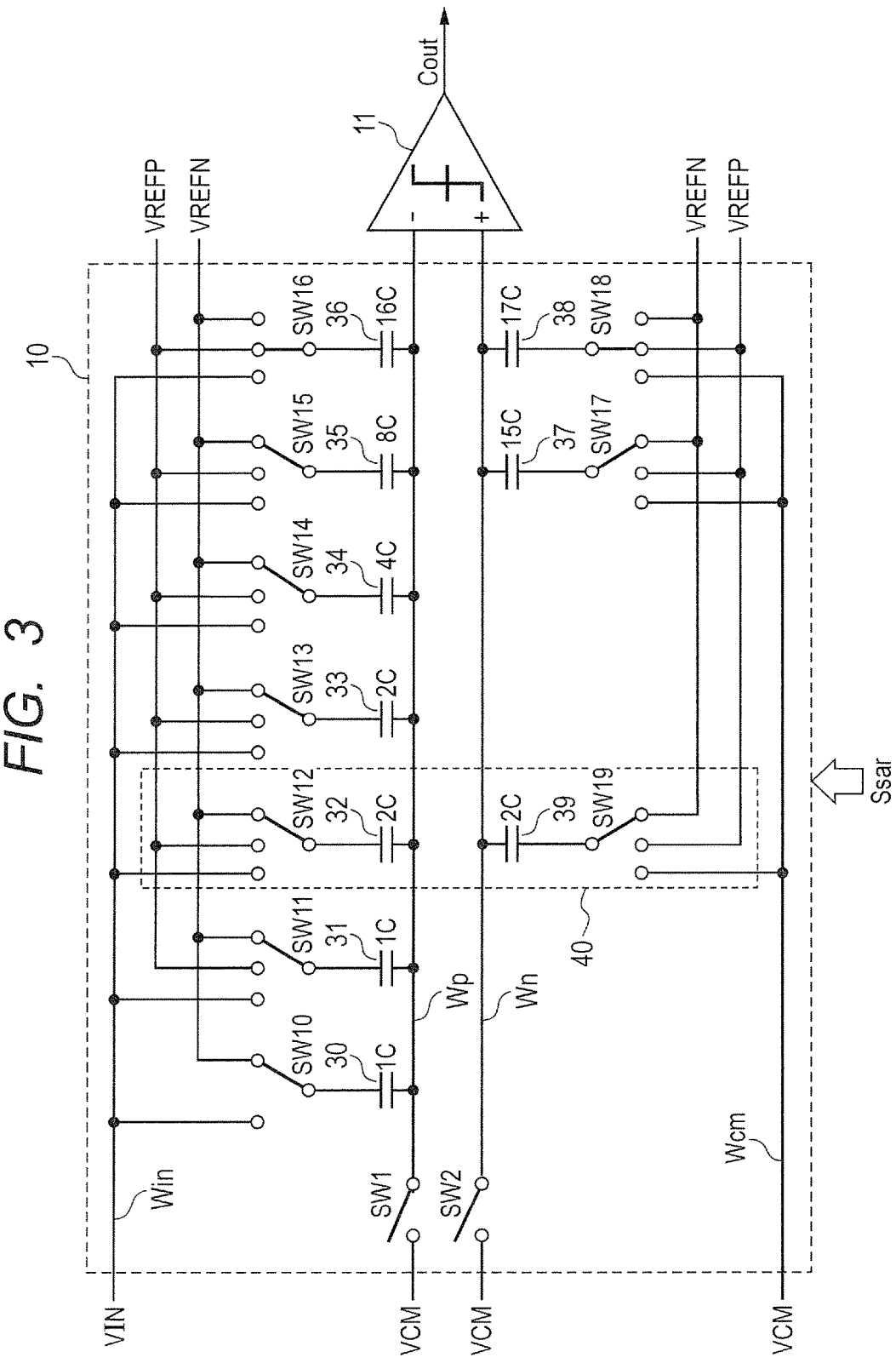
FIG. 3 is a circuit diagram showing a capacitance DAC circuit according to Embodiment 1.

Next, the details of the capacity DAC circuit 10 according Embodiment 1 will be explained. FIG. 3 shows a circuit diagram of the capacity DAC circuit 10 according to Embodiment 1. In addition, FIG. 3 also shows the comparator 11 in order to clarify the configuration of the capacity DAC circuit 10. Moreover, FIG. 3 shows the status of the switch at the time of performing the first comparison operation.

As shown in FIG. 3, the capacity DAC circuit 10 includes: capacitors 30 to 39, common voltage supplying changeover switches (for example, switches SW1 and SW2), switches SW10 to SW19, the first compare wiring Wp, the second compare wiring Wn, the inputting wiring Win, and the common voltage wiring Wcm.

As for the first comparison wiring Wp, one end is coupled to the reversal input terminal of the comparator 11 and the switch SW1 is coupled to the other end. Further, the common voltage VCM is transmitted to the first comparison wiring Wp in the period where the switch SW1 is controlled to be in the closed state.

Moreover, one end of two or more first capacitors (for example, capacitors 30 to 36) is coupled to the first comparison wiring Wp. The capacitors 30 to 36 have capacitance values corresponding to the weights of the bits for conversion, respectively. In the example shown in FIG. 3, the capacitor of the capacitance values of 2C (twice of 1C), 4C (4 times of 1C), 8C (8 times of 1C), and 16C (16 times of 1C) is formed assuming 1C as a unit capacitance.

A capacitor 30 is a dummy capacitor which has a capacitance value of 1C. The first switch SW10 is provided in the other end of the electrostatic capacitor 30. The first switch SW10 selects and gives the input signal VIN, and the low voltage-potential side reference voltage VREFN and any one to the other end of a capacitor 30.

A capacitor 31 is a capacitor which has a capacitance value of 1C corresponding to the weight corresponding to the least significant bit of a conversion result. The first switch SW11 is provided in the other end of the capacitor 31. The first switch SW11 selects and gives the input signal VIN, the high voltage-potential side reference voltage VREFP and the low voltage-potential side reference voltage VREFN, and anyone to the other end of a capacitor 31.

A capacitor 32 is a redundant bit capacitor which has a capacitance value of 2C corresponding to the weight corresponding to the redundant bit of a conversion result. Moreover, a capacitor 32 has the same capacitance value as the capacitor 33 corresponding to the second bit of the conversion result to be described later. That is, in the analog-to-digital conversion circuit 1 according to Embodiment 1, it has a redundant bit between LSB and the second bit in a conversion result. The first switch SW12 is provided in the other end of the capacitor 32. The first switch SW12 selects and gives the input signal VIN, the high-potential side reference voltage VREFP and the low-potential side reference voltage VREFN, and any one to the other end of a capacitor 32.

A capacitor 33 is a capacitor which has a capacitance value of 2C corresponding to the weight corresponding to the second bit of a conversion result. The first switch SW13 is provided in the other end of the capacitor 33. The first switch SW13 selects and gives the input signal VIN, the high-potential side reference voltage VREFP and the low-potential side reference voltage VREFN, and any one to the other end of the capacitor 33.

A capacitor 34 is a capacitor which has a capacitance value of 4C corresponding to the weight corresponding to the third bit of a conversion result. The first switch SW14 is provided in the other end of the capacitor 34. The first switch SW14 selects and gives the input signal VIN, the high-potential side reference voltage VREFP and the low-potential side reference voltage VREFN, and any one to the other end of the capacitor 34.

A capacitor 35 is a capacitor which has a capacitance value of 8C corresponding to the weight corresponding to the fourth bit of a conversion result. The first switch SW15 is provided in the other end of the capacitor 35. The first switch SW15 selects and gives the input signal VIN, the high-potential side reference voltage VREFP and the low-potential side reference voltage VREFN, and any one to the other end of the capacitor 35.

A capacitor 36 is a capacitor which has a capacitance value of 16C corresponding to the weight corresponding to the fifth bit of a conversion result. The first switch SW16 is provided in the other end of the capacitor 36. The first switch SW16 selects and gives the input signal VIN, the high-potential side reference voltage VREFP and the low-potential side reference voltage VREFN, and any one to the other end of the capacitor 36.

As for the second comparison wiring Wn, one end is coupled to the right transmission terminal of a comparator 11, and switch SW2 is coupled to the other end. Then, the common voltage VCM is transmitted to the second comparison wiring Wn in the period which is controlling the switch SW2 to the closed state.

Moreover, the end of two or more second capacitors (for example, capacitors 37 to 39) is coupled to the second comparison wiring Wn. The capacitors 37 to 39 serve as the capacitance values for the total capacitance of two or more first capacitors (for example, capacitors 30 to 36) with the same total capacitance values. A capacitor 39 is a redundant bit capacitor which has a capacitance value according to the weight of the redundant bit. The total capacitance values of capacitors 37 and 38 is set as the capacitance value which is obtained by subtracting the capacitance value of the redundant bit capacitor from the total capacitance value of capacitors 30 to 36. In addition, in the capacitance DAC circuit 10 shown in FIG. 3, the common voltage to capacitors 37 to 39 is supplied through the common wiring Wcm.

A second switch SW17 is provided at the other end of the capacitor 37. The second switch SW17 selects and gives the common voltage VCM, the high-potential side reference voltage VREFP, or the low-potential side reference voltage VREFN to the other end of the capacitor 37. In the example shown in FIG. 3, the low-potential side reference voltage VREFN is given to the other end of the capacitor 37 through the second switch SW17. A second switch SW18 is provided at the other end of the capacitor 38. The second switch SW18 selects and gives the common voltage VCM, the high-potential side reference voltage VREFP, or the low-potential side reference voltage VREFN to the other end of the capacitor 38. In the example shown in FIG. 3, the high-potential side reference voltage VREFP is given to the other end of the capacitor 38 through the second switch SW18. A second switch SW19 is provided at the other end of the capacitor 39. The second switch SW19 selects and gives the common voltage VCM, the high-potential side reference voltage VREFP, or the low-potential side reference voltage VREFN to the other end of the capacitor 39.

In the example shown in FIG. 3, since the redundant bit is set at the location corresponding to the second bit of a conversion result, the capacitance value of the capacitor 39 is set to 2C. Moreover, since the total capacitance value of the capacitors 30 to 36 is set to 34C, the total capacitance value of the capacitors 37 and 38 is set to 32C which is obtained by subtracting 2C from 34C. The low-potential side reference voltage VREFN is supplied to the other end of the capacitor 39 being a redundant-bit capacitor at the time of a starting of a conversion processing. In this regard, the capacitors 37 and 38 are used in order to stabilize the voltage of the second comparison wiring Wn as a common voltage VCM. Therefore, in the capacitance DAC circuit 10, upon starting the conversion process, it is preferable to allow the capacitance value of the capacitor provided between the second comparison wiring Wn and a wiring to which the low-potential side reference voltage VREFN is supplied to be equal to the capacitance value of the capacitor provided between the second comparison wiring Wn and the wiring to which the high-potential side reference voltage VREFP is supplied. Therefore, in the example shown in FIG. 3, the capacitance value of the capacitor 38 of which the low-potential side reference voltage VREFN is supplied to the other end and the total capacitance value of the capacitors 37 and 39 of which high-potential side reference voltage VREFP is supplied to the other end are made the same. Specifically, the capacitor 39 is 2C and the total capacitance value of the capacitors 37 to 39 is 34C. Therefore, 17C which is obtained by dividing 34C by two is made to be the capacitance value of the capacitor 38, and 15C which is obtained by subtracting 2C from 17C is made to be the capacitance value of the capacitor 37. In addition, in the following explanations, the capacitors 37 and 38 are called a regulation capacitor as the case.

As shown in FIG. 3, in the capacitance DAC circuit 10, a conversion processing is performed with the resolution of 5 bits, but a 1-bit redundant bit is included in this conversion result. That is, the conversion result of a 1-bit redundant bit and a 5-bit conversion result are included in the pre-conversion result outputted from the sequential comparison register logic 12. Moreover, before the capacitance DAC circuit 10 starts a conversion processing, it is in the state which initializes the first comparison wiring Wp and the second comparison wiring Wn on the common voltage VCM, and samples the input signal VIN to capacitors 30 to 36. Then, the capacitance DAC circuit 10 controls a switch toward switch SW16 to switch SW11, whenever the stage of a conversion processing progresses. Moreover, the capacitance DAC circuit 10 performs the redundant comparison based on a redundant bit using capacitors 32 and 39. In FIG. 3, the circuit containing capacitors 32 and 39 is made into the redundant bit circuit 40.

Figure 4:
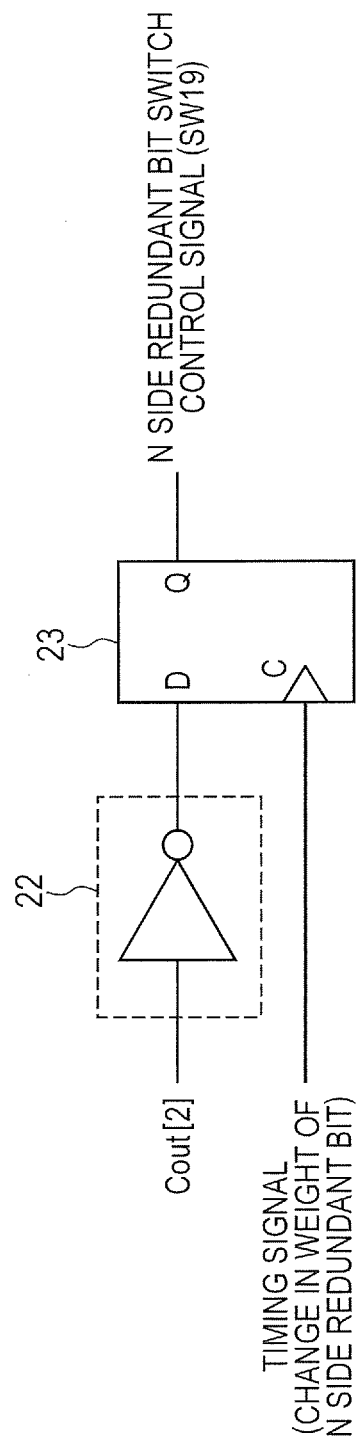
FIG. 4 is a block diagram showing a redundant bit control circuit and a resistor corresponding to the redundancy bit control circuit according to Embodiment 1.

Now, details of the successive comparison register logic 12 will be explained. In view of the above, there is shown a block diagram in FIG. 4 of a redundant bit control circuit and a register corresponding to the redundant bit control circuit. In addition, the redundant bit control circuit 22 shown in FIG. 4 is an example of the redundant bit control circuit 22, and various combinational circuits are applicable as the redundant bit control circuit 22. As shown in FIG. 4, the redundant bit control circuit 22 has an inverter circuit. This inverter circuit inverts a comparison result Cout [2] about a second bit to which a comparison operation is performed immediately before the comparison operation (hereafter, "redundant comparison operation") corresponding to the redundant bit, and outputs it to a register provided corresponding to the redundant bit control circuit 22 in a register 23.

Moreover, as a resistor, there is used a D flip-flop which holds, at the timing as a rising edge of a signal is inputted to a trigger input terminal C, a signal level inputted to the input terminal D to the timing when a rising edge of the signal is inputted to the trigger input terminal C next time. The resistor which corresponds to the redundant bit control circuit 22 is one of the registers included in the resistor 23. In an example shown in FIG. 4, to the register corresponding to the redundant bit control circuit 22, a timing signal which the ADC timing control circuit 14 outputs is inputted to the resistor corresponding to the redundant-bit control circuit 22 as a trigger signal. The timing signal inputted to the resistor corresponding to the redundant bit control circuit 22 has a rising edge to the timing at which the weighting of the redundant bit is changed. Moreover, a reset signal to be inputted to the D flip-flop circuit is omitted in the D flip-flop circuit shown in FIG. 4. However, in the D flip-flop circuit, an output shall be reset at the low level to a given timing after the completion of the comparison operation to a start of the next comparison operation.

Moreover, although no particularly described in FIG. 4, a switch control signal Ssar other than a switch control signal Ssar corresponding to the redundant bit coupled to the second comparison wiring Wn side is at low level in its initial state. Further, they are so controlled to be at a high level just before a comparison operation is performed, remains at the high level if the comparison result is at the high level after the comparison operation, and if the comparison result is at a low level, to be returned to the low level by the redundant bit control circuit 22 and the register 23.

Figure 5:
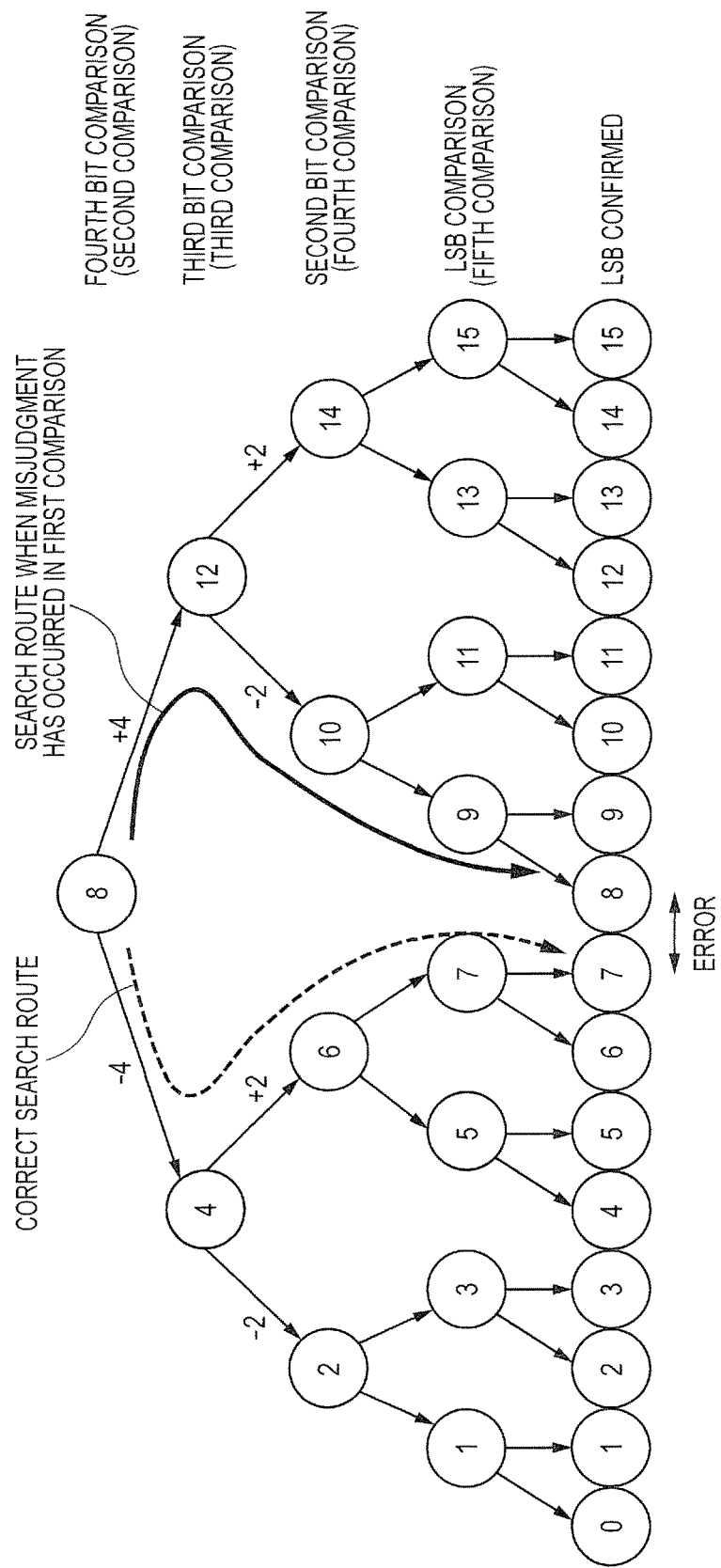
FIG. 5 is a diagram for explaining a binary search route of low-order 4 bits in an analog-to-digital conversion circuit not having a redundant bit.

Next, an operation of the analog-to-digital conversion circuit 1 according to Embodiment 1 will be explained. In the analog-to-digital conversion circuit 1 according to Embodiment 1, an incorrect conversion is corrected by performing the redundant comparison which uses the redundant bit circuit. In order to explain this incorrect conversion, first, FIG. 5 shows a diagram which describes binary search route for low-order 4 bits in an analog-to-digital conversion circuit not having a redundant bit. In addition, in the diagram of FIG. 5 and diagrams of binary search routes shown hereafter, circled numbers indicate weights used during performance of respective comparison operations. In the analog-to-digital conversion circuit, for example, when a comparison result of a fifth bit is at the low level, a weight of the fifth bit is set to "0". Then, when performing a compare operation of the 4th bit, after giving the high-potential side reference voltage VREFP to the other end of a capacitor 35 which has a capacitance value of 8C, the compare operation of the 4th bit is performed. When the comparison result of the fourth bit is at the high level, a weight of the fourth bit is set to "8". Then, after giving the high-potential side reference voltage VREFP to the other end of a capacitor 34 which has a capacitance value of 4C corresponding to the third bit, a comparison operation of the third bit is performed. On the other hand, when the comparison result of the fourth bit is at the low level, the weight of the fourth bit is set to "0". Then, after giving the high-potential side reference voltage VREFP to the other end of the capacitor 34 which has a capacitance value of 4C corresponding to the third bit, the comparison operation of the third bit is performed. That is, the comparison operation of the third bit is performed with the weight being "4" or "12". The binary search routes shown in FIG. 5 are the diagrams describing such operations of the analog-to-digital conversion circuit.

As shown in FIG. 5, in the analog-to-digital conversion circuit, the comparison operations are repeated based on the binary search method. Therefore, there is only one search route for reaching each final result. For that reason, if a redundant comparison is not performed, when an incorrect conversion occurs in the high-order bit, an error due to the incorrect conversion is not corrected in the final conversion result.

Figure 6:
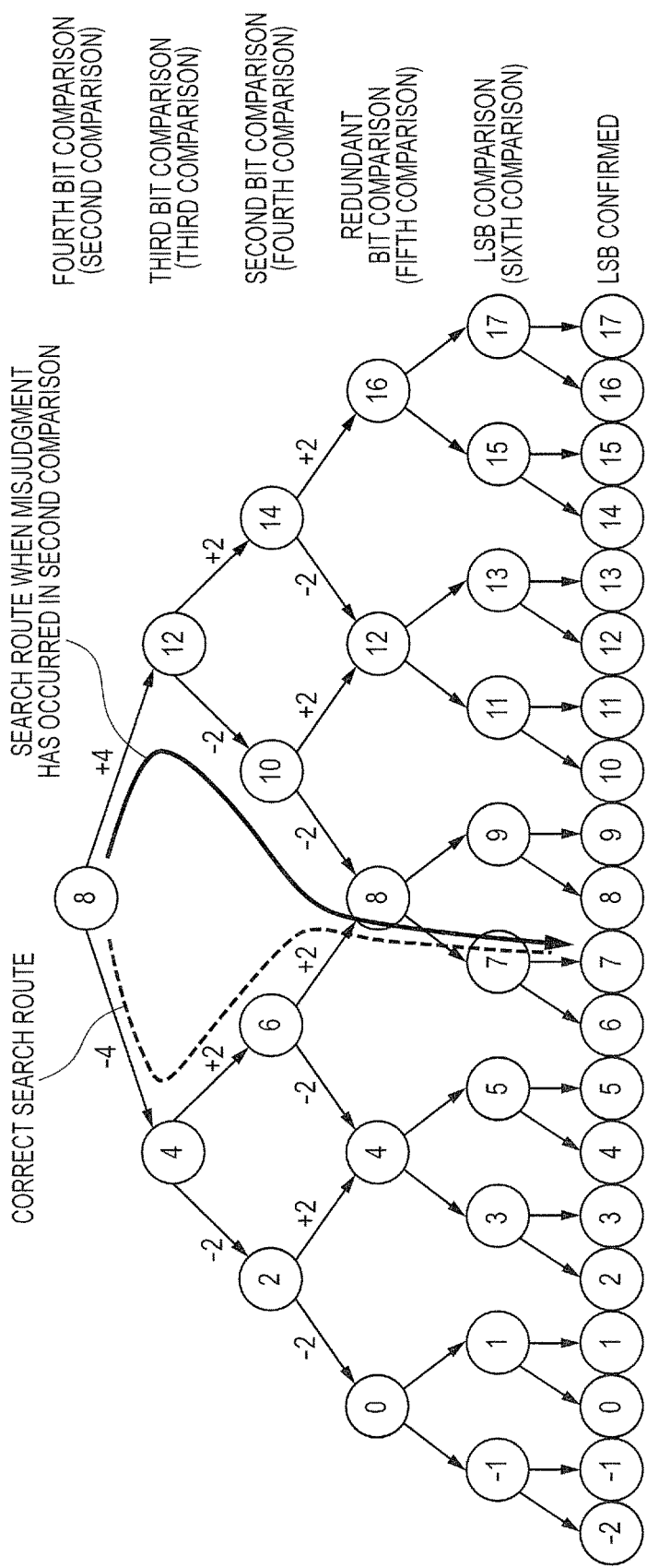
FIG. 6 is a diagram for explaining a binary search route of low-order 4 bits in the analog-to-digital conversion circuit according to Embodiment 1.

FIG. 6 shows a diagram explaining a binary search route for low-order 4 bits in a analog-to-digital conversion circuit 1 according to Embodiment 1. Further, in FIG. 6, a circled number shows a weight when each comparison operation is performed. As shown in FIG. 6, in the analog-to-digital conversion circuit 1 according to Embodiment 1, a redundant comparison operation using the redundant bit is performed curing a comparison between a lowest-order bit and a second bit. In the redundant comparison, an effect can be given to a conversion result with the same weight as that of the second bit. Specifically, by performing the redundant comparison, at least two search routes for reaching one final result are formed. Therefore, in the analog-to-digital conversion circuit 1 according to Embodiment 1, even when an incorrect conversion occurs, it is possible to reach a conversion result to be obtained through an alternative search route.

Figure 7:
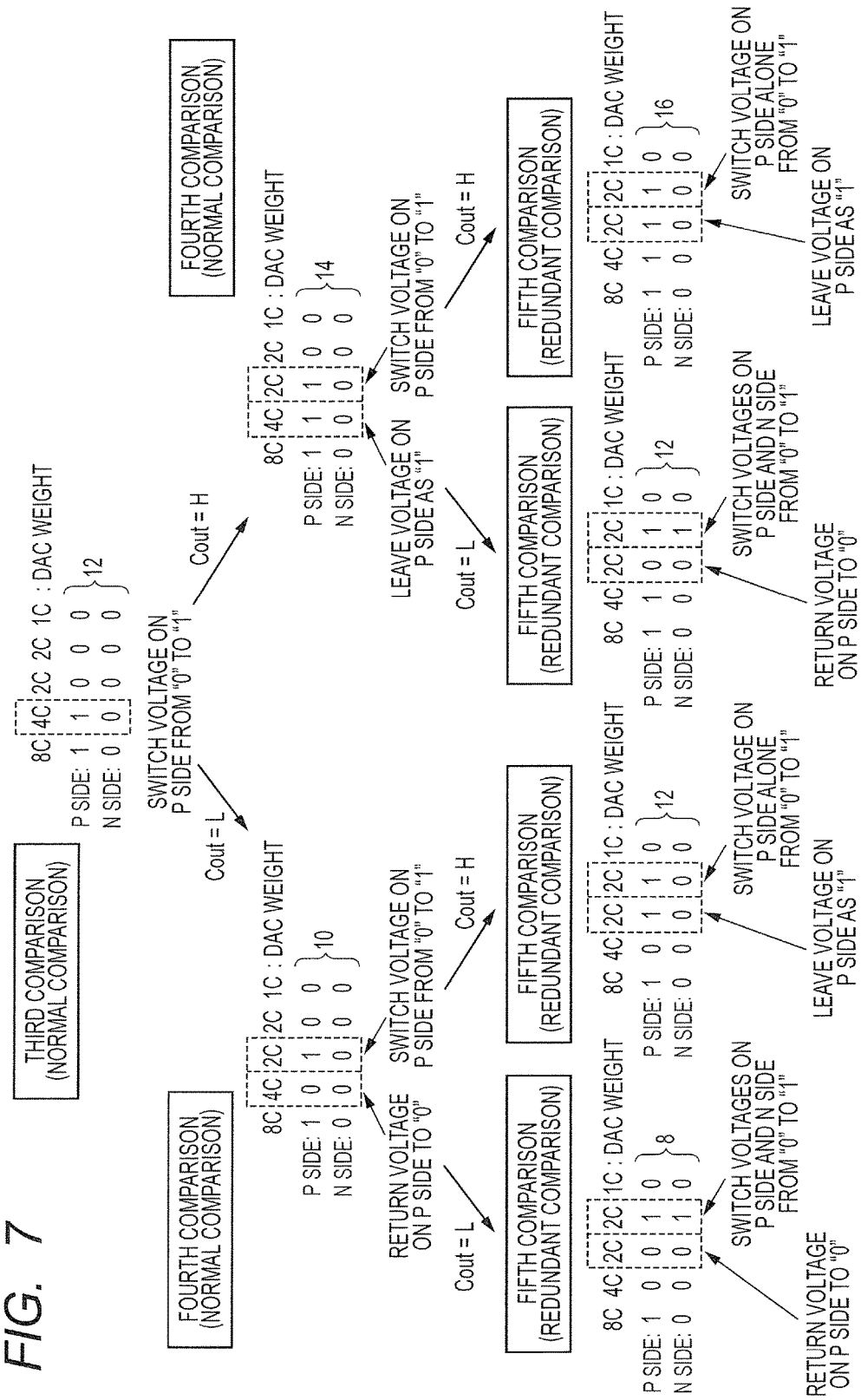
FIG. 7 is a diagram for explaining an example of a control of the redundant bit of the analog-to-digital conversion circuit according to Embodiment 1.

Next, switching control in the capacitor DAC circuit 10 of the analog-to-digital conversion circuit 1 according to Embodiment 1 will be explained. FIG. 7 shows a diagram for explaining a control example of a redundant bit of an analog-to-digital conversion circuit according to Embodiment 1. FIG. 7 describes control of a first switch and a second switch between a comparison operation of a third bit and a redundant comparison operation using a redundant bit. Moreover, in FIG. 7, "1" indicates a state where the high-potential side reference voltage VREFP is selected by the first switch and the second switch. Further, "0" indicates a state where the low-potential side reference voltage VREFN is selected by the first switch and the second switch.

As shown in FIG. 7, in a third comparison where a comparison operation of the third bit is performed, switching is made as to the reference voltage selected by a first switch SW14 of a P side (for example, a first comparison wiring Wp side) of the third bit from the low-potential side reference voltage VREFN to the high-potential side reference voltage VREFP. In the third comparison, the comparison operation is performed in this state. When the comparison result Cout is at the low level, the reference voltage selected by the first switch SW14 in the fourth comparison where the comparison operation of the second bit is performed is returned from the high-potential side reference voltage VREFP to the low-potential side reference voltage VREFN. On the other hand, when the comparison result Cout in the third comparison is at the high level, the reference voltage selected by the first switch SW14 in the forth comparison where the comparison operation of the second bit is performed is left as the high-potential side reference voltage VREFP.

Next, in a fourth comparison, switching is made as to a reference voltage selected by a first switch SW13 on a P side (for example, a first comparison wiring Wp side) of the second bit from the low-potential side reference voltage VREFN to the high-potential side reference voltage VREFP. In the fourth comparison, the comparison operation is performed in this state. When the comparison result cout is at a low level, the reference voltage selected by the first switch SW13 at the fifth comparison where the comparison operation of the redundant bit is performed is returned to the low-potential side reference voltage VREFN from the high-potential side reference voltage VREFP. On the other hand, when the comparison result Cout of the fourth comparison is at a high level, the reference voltage selected by the first switch SW13 in the fifth comparison where the comparison operation of the redundancy bit is performed is kept as the high-potential side reference voltage VREFP.

Next, in a fifth comparison, switching is made as to a reference voltage selected by a first switch SW12 on a P side of a redundant bit (for example, the first comparison wiring Wp side) from the low-potential side reference voltage VREFN to the high-potential side reference voltage VREFP in the fifth comparison. Moreover, in the fifth comparison where the redundant comparison is performed, a reference voltage selected by a second switch SW19 of an N side the redundant bit (for example, a second comparison wiring Wn) is controlled. To be specific, when the comparison result Cout of the fourth comparison is at a low level, the reference voltage selected by the second switch SW19 is switched from the low-potential side reference voltage VREFN to the high-potential side reference voltage VREFP. This process corresponds to achieving negative weighting in an equivalent manner because a DAC output on the N side changes toward the high-potential side with respect to a DAC output on the P side. On the other hand, when the comparison result Cout of the fourth comparison is at the high level, the reference voltage selected by the second switch SW19 is kept as the low-potential side reference voltage VREFN.

Thus, in the analog-to-digital conversion circuit 1 according to Embodiment 1, as to the switch arranged on the P side (first comparison wiring Wp side) where sampling of input signals is performed, the first switch corresponding to a bit to be compared is allowed to select the high-potential side reference voltage VREFP. Then, according to the conversion result, a changeover is made as to where the reference voltage to be selected by the first switch corresponding to the bit where the comparison operation is performed should be the high-potential side reference voltage VREFT or the low-potential side reference voltage VREFN. Also, as to the switch arranged at the P side (1st compare wiring Wp side) to which a sampling of an input signal is performed. It is changed whether according to a conversion result, the reference voltage which the first switch corresponding to the weight which performs the comparison operation selects is made into the high-potential side reference voltage VREFP, or it is considered as the low-potential side reference voltage VREFN. Moreover, as to the second switch corresponding to the redundant bit, based on a comparison result obtained in the comparison operation immediately before the operation concerned, a changeover is made whether to select the high-potential side reference voltage VREFP or to select the low-potential side reference voltage VREFN. Moreover, based on the comparison result obtained in the comparison operation immediately before the operation concerned, whether or not to give a negative weight is determined.

Figure 8:
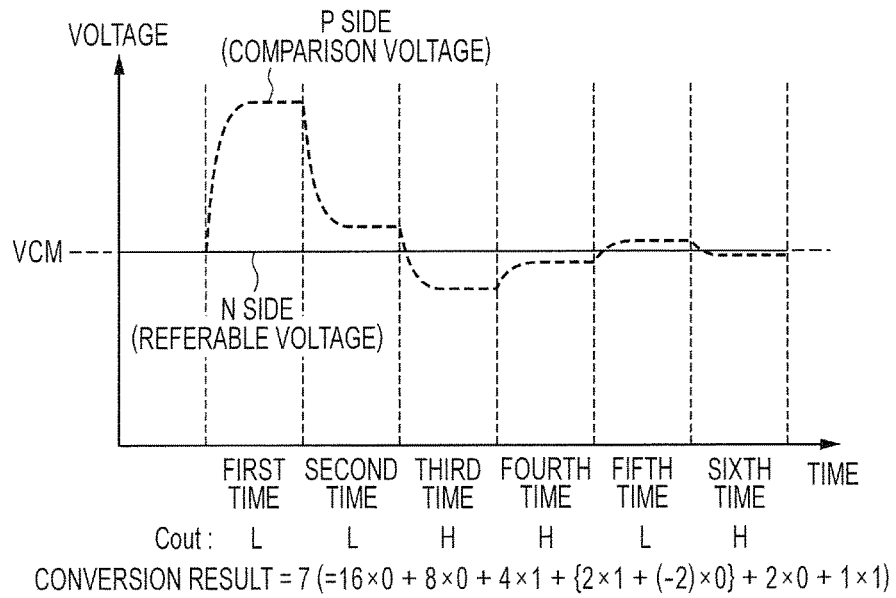
FIG. 8 is a diagram for explaining a switch control of the capacitance DAC circuit of the analog-to-digital conversion circuit according to Embodiment 1.
Figure 8:
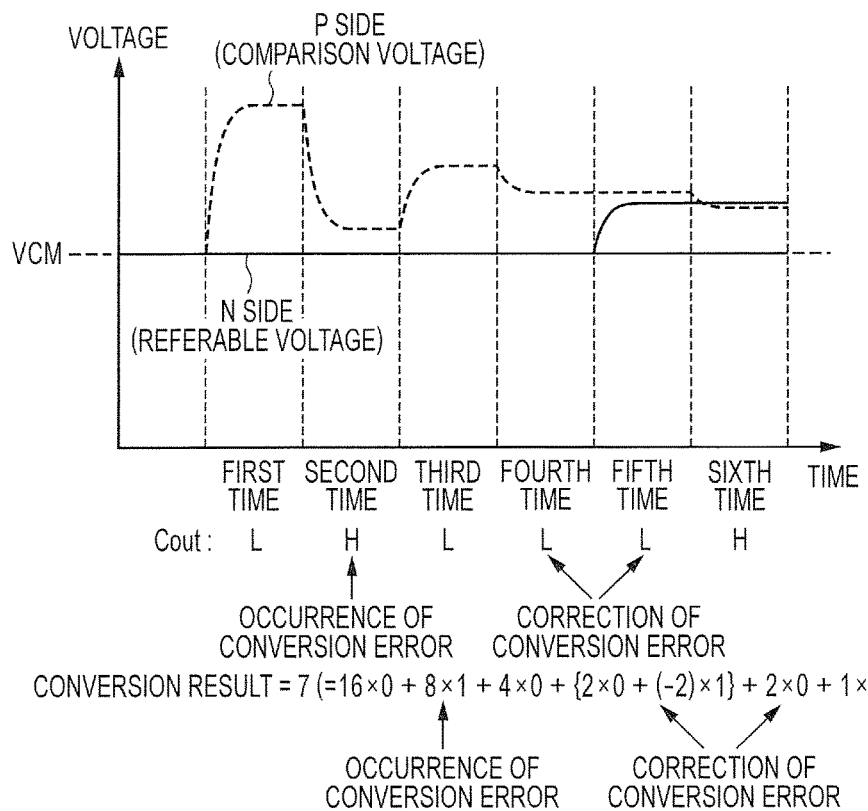

Next, a specific operation of the switch control described above will be explained. FIG. 8 shows a diagram which explains the switch control of a capacitance DAC circuit of an analog-to-digital conversion circuit 1 according to Embodiment 1. In FIG. 8, a voltage waveform (P side of FIG. 8) of a first comparison wiring Wp and a voltage waveform (N side of FIG. 8) of a second comparison wiring Wn are shown. Moreover, FIG. 8 shows, in its upper drawing, a voltage waveform when a comparison operation of a fourth bit is correctly performed and, in its lower drawing, a voltage waveform when the comparison operation of the fourth bit is not correctly performed. Therefore, in FIG. 8, there occurs a difference in voltage on the P side between the case of the upper drawing and the case of the lower drawing in a comparison operation (third comparison) of a third bit which is performed based on a voltage on the P side decided based on a result of the comparison operation of the fourth bit.

As shown in FIG. 8, in the analog-to-digital conversion circuit 1 according to Embodiment 1, when the comparison operation is performed without an error, there is no change in a reference voltage selected by a second switch SW19 arranged on the N side in a fifth comparison where a redundant comparison is performed. Therefore, a voltage on the N side is left as VCM. On the other hand, when there occurs an error in one of the comparison operations, in the fifth comparison where the redundant comparison is performed, the reference voltage selected by the second switch SW19 arranged on the N side is switched from the low-potential side reference voltage VREFN to the high-potential side reference voltage VREFP. Therefore, there occurs a change in a reference voltage on the N side according to a weight of a redundant bit. That is, in the fifth comparison, the comparison operation is performed with use of a referable voltage whose value differs from that of a referable voltage in the fourth comparison. In this way, in the analog-to-digital conversion circuit 1 according to Embodiment 1, an effect of a misjudgment occurred in the second comparison is corrected. Moreover, in a pre-conversion result of the analog-to-digital conversion circuit 1 according to Embodiment 1, there is included high level/low level information, i.e., presence information of negative weighting, of an N side redundant bit in the bit corresponding to a comparison result of the bit to which comparison is made immediately before the redundancy bit. Therefore, an error having occurred in a high-order bit is corrected. In the example shown in FIG. 8, by performing the redundant comparison, "7" can be obtained as a conversion result regardless of the presence of an error.

Figure 9:
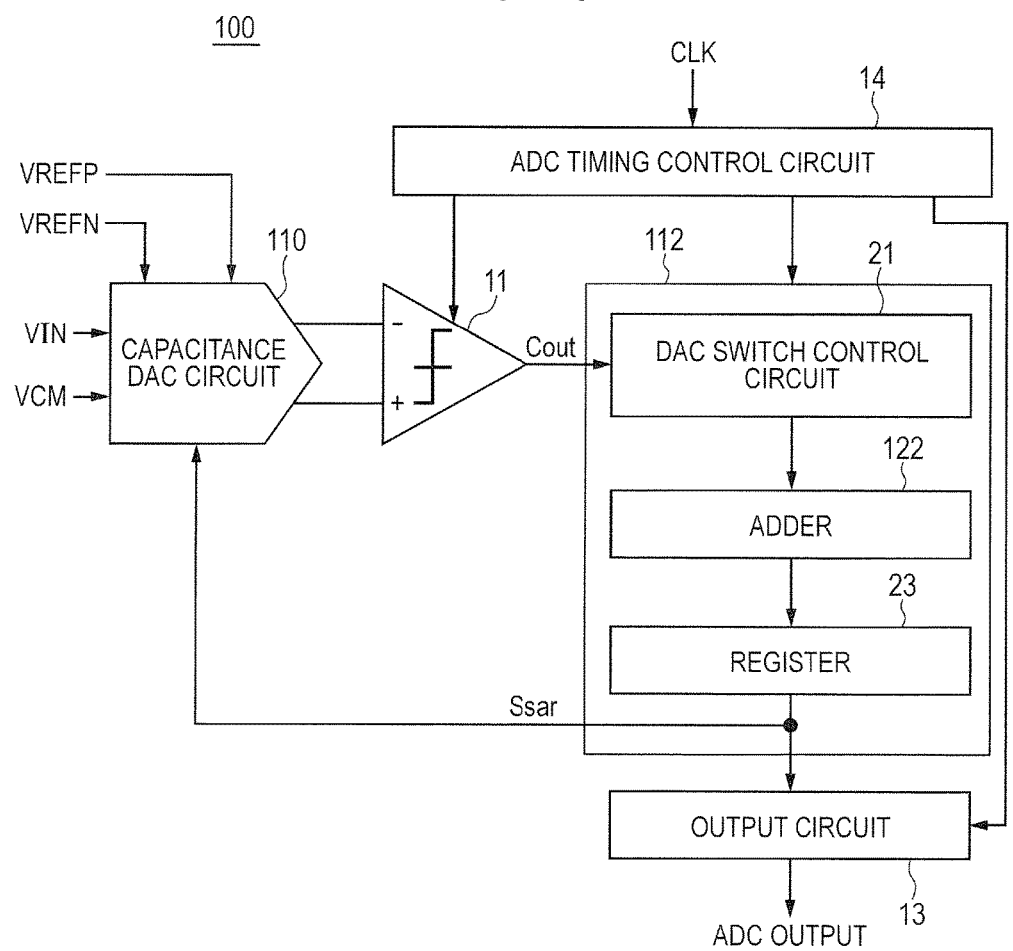
FIG. 9 is a block diagram showing an analog-to-digital conversion circuit according to a comparative example.

In this regard, in order to further clarify characteristics of the configuration of the analog-to-digital conversion circuit 1 according to Embodiment 1, as a comparative example, an analog-to-digital conversion circuit 100 not having a redundant bit on a second comparison wiring Wn side will be explained. FIG. 9 shows a block diagram of the analog-to-digital conversion circuit 100 according to the comparative example.

As shown in FIG. 9, in place of the capacitance DAC circuit 10 and the successive comparison register logic 12 of the analog-to-digital conversion circuit 1 according to Embodiment 1, the analog-to-digital conversion circuit 100 according to the comparative example includes a capacitance DAC circuit 110 and a successive comparison resistor logic 112. In the successive comparison resistor logic 112, an adder 112 is provided in place of the redundant bit control circuit 22 of the successive comparison resistor logic 12. The adder 122 calculates to reduce the digit number in an already determined conversion result when performing the redundant comparison using the redundant bit.

Figure 10:
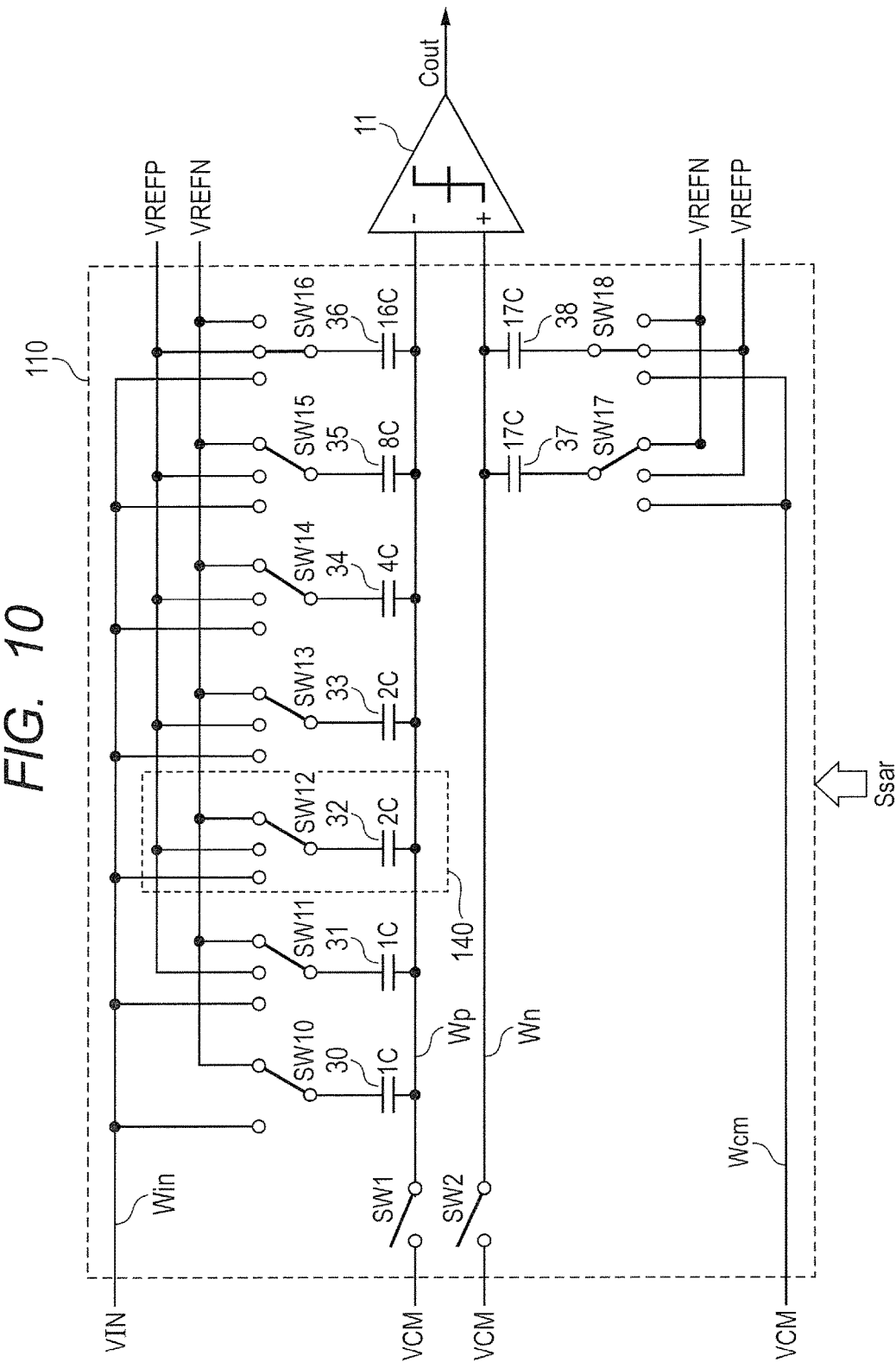
FIG. 10 is a circuit diagram showing a capacitance DAC circuit according to the comparative example.

FIG. 10 shows a circuit diagram of the capacitance DAC circuit 110 according to the comparative example. As shown in FIG. 10, the capacitance DAC circuit 110 according to the comparative example is the one in which the capacitor 39 and the second switch SW19 are removed from the capacitance DAC circuit 10 according to Embodiment 1. In FIG. 10, a circuit in which the capacitor 39 and the second switch SW19 are removed from the redundant bit circuit 40 is shown as a redundant bit circuit 140.

Figure 11:
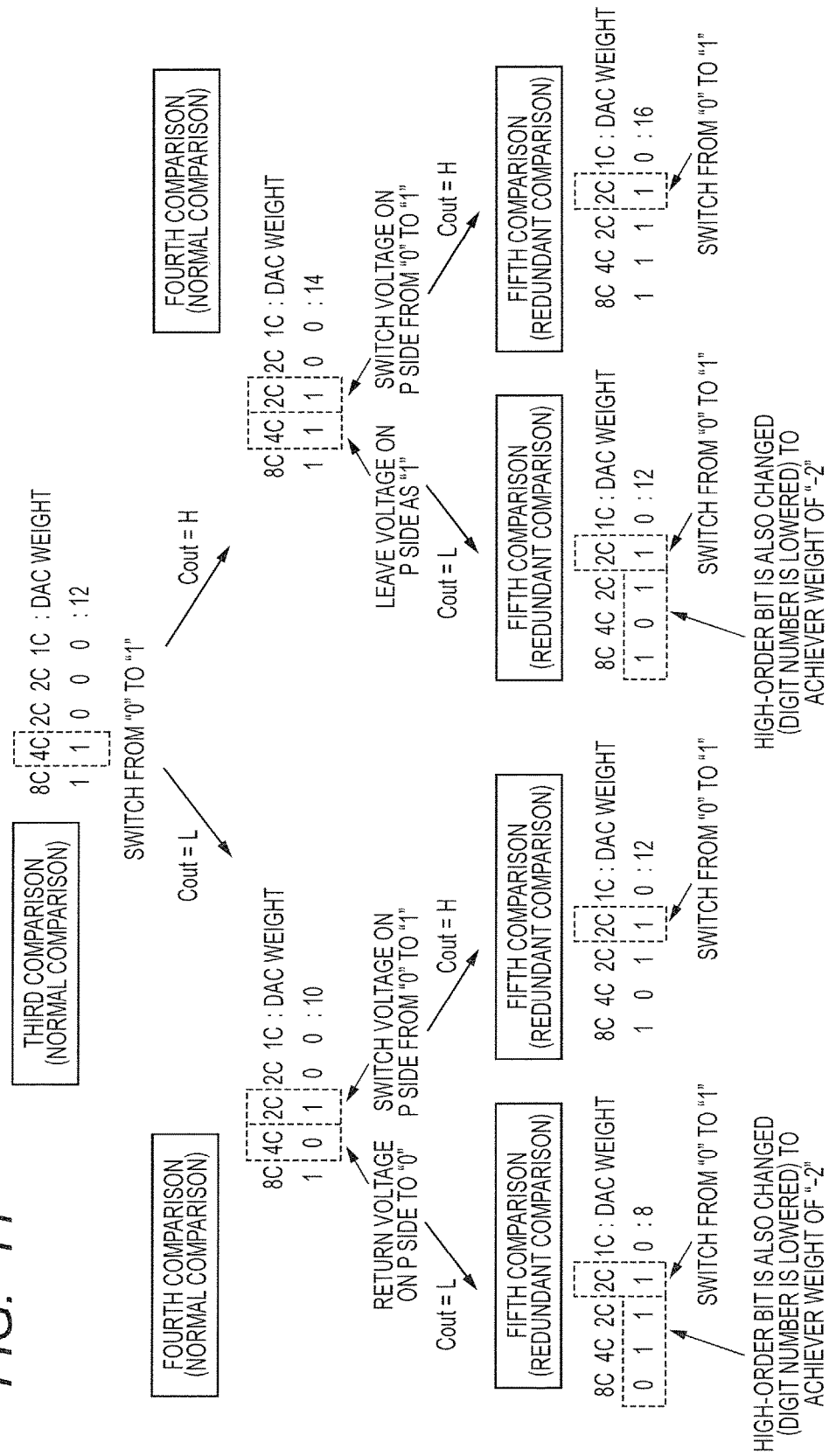
FIG. 11 is a diagram for explaining an example of a control of a redundant bit of the analog-to-digital conversion circuit according to the comparative example.

Next, there will be explained a switch control in the capacitance DAC circuit 110 of the analog-to-digital conversion circuit 100 according to a comparative example. FIG. 11 explains an example of control of the redundant bit of the analog-to-digital conversion circuit 100 according the comparative example. FIG. 11 shows control of the first switch and the second switch from the comparison operation of the third bit to the redundant comparison operation using the redundant bit. Moreover, in FIG. 11, "1" shows a state where the first switch selects the high-potential side reference voltage VREFP and "0" shows a state where the first switch selects the low-potential side reference voltage VREFN.

As shown in FIG. 11, the operation of the third comparison where the third bit comparison is performed and a comparison operation of the second bit is performed are the same as the operation of the first switch arranged on the P side of the analog-to-digital conversion circuit 1 according to Embodiment 1 explained in FIG. 7. Therefore, the explanation thereof will be omitted. On the other hand, the operation of the fifth comparison where the redundant comparison using a redundant bit is performed differs in the analog-to-digital conversion circuit 1 of Embodiment 1 and in the analog-to-digital conversion circuit 100 of the comparative example. Therefore, the operations thereof will be explained below.

In a fifth comparison according to the comparative example, regardless of the conversion result of the fourth comparison, there is made a changeover of the reference voltage selected by the first switch SW12 corresponding to the redundant bit from the low-potential side reference voltage VREFN to the high-potential side reference voltage VREFP. Moreover, in the fifth comparison according to the comparative example, in response to a value of the comparison result of the fourth comparison, the value which is already determined as the conversion result is changed. To be specific, when the comparison result of the fourth comparison is at a low level, values from the fourth bit to a second bit are changed. To be specific, the values between the fourth bit and the second bit are made to be values found by subtracting "2" which is a weight of the redundant bit from the value acquired by the comparison processing till then. On the other hand, when the comparison result of the fourth comparison is at a high level, the values between the fourth bit and the second bit are not changed.

Thus, in the analog-to-digital conversion circuit 1 according to the comparative example, in order to achieve the weight during the redundant comparison using the redundant bit, it is necessary to change a value of the already determined conversion result. Further, in order to change the value, it is necessary to calculate with use of an adder 122 etc.

As described above, in the analog-to-digital conversion circuit 1 according to Embodiment 1, a redundant bit capacitor (for example, a capacitor 39) is provided in a second comparison wiring Wn where there is produced a referable voltage which is a comparison target of the compare voltage which varies in a comparison cycle in a comparative operation of the capacitance DAC circuit 10. Then, the reference voltage to be applied to the other end of the redundant bit capacitor is switched based on a comparison result of a comparison operation immediately before the redundant comparison operation. In the analog-to-digital conversion circuit 1 according to Embodiment 1, with such circuit configuration and switching control, translation result which has a negative weight can be obtained by performing such a circuit configuration and a switch control, without changing the conversion result determined till then at the time of a redundant comparison operation. Further, in order to perform this operation, it serves the purpose if a simple combinational circuit such as the redundant bit control circuit 22 shown in FIG. 4 is be adopted. Thus, in the analog-to-digital conversion circuit 1 according to Embodiment 1, since the time delay required for the switch control in the redundant comparison operation, it becomes possible to shorten time required for the control and achieve high-speed conversion processing.

Moreover, in the analog-to-digital conversion circuit 1 according to Embodiment 1, the delay time required for the switch control in the redundant comparison operation can be considerably small. Therefore, even if it a period for the redundant comparison operation is allowed to be the same as a period of other normal operation, it becomes possible to sufficiently secure time for the output of the capacitor DAC circuit 10 to converge. Therefore, it becomes possible to stabilize the operation of the analog-to-digital conversion circuit.

The degradation of the conversion rate at the time of the redundant compare operation which used the redundancy bit poses a big problem, and the effectiveness which raises the conversion rate of this redundant comparison operation is considerable in the single-end type analog-to-digital conversion circuit using a single-ended signal as an input signal VIN.

Moreover, in order to raise a conversion accuracy also in a single-end type analog-to-digital conversion circuit, it is an ideal to equalize the total capacitance value of the capacitor by the side of the first comparison wiring Wp and the total capacitance value of the capacitor by the side of the second comparison wiring Wn. In this regard, a capacitor 39 which serves as a redundant-bit capacitor is formed in the second comparison wiring Wn side in the analog-to-digital conversion circuit 1 according to Embodiment 1. However, the total capacitance value of the capacitor 39 and the capacitors 37 and 38 being regulation capacitors is the same as the total capacitance value of the capacitors 30 to 36 being first capacitors. That is, in the analog-to-digital conversion circuit 1 according to Embodiment 1, even if a redundant-bit capacitor is provided on the second comparison wiring Wn side, the total capacitance value of the capacitor is the same as the case where a redundant-bit capacitor is not formed, and there is no increase in the dimension of a semiconductor chip.

Moreover, for example, when performing a redundant comparison like the analog-to-digital conversion circuit 100 according to the comparative example, in a case where a changeover is made as to the switch corresponding to a higher-order bit than a redundant bit, there occurs a momentary current in which a current value sharply changes due to the charge and discharge to the capacitor corresponding to the bit of a higher-order than a redundant bit. When such a momentary current occurs, the reference voltage is varied by inductance constituents being parasitic in wirings inside a semiconductor device, wires for coupling a semiconductor chip with a package, a pin of the package, etc., causing a problem of deteriorating the conversion accuracy. However, in the analog-to-digital conversion circuit 1 according to Embodiment 1, when performing a redundant compare operation, there is only one switch related to the redundant bit which changes targets to be coupled when performing a redundant comparison operation. Therefore, unlike the analog-to-digital conversion circuit 100 according the comparative example, a momentary current does not occur in the analog-to-digital conversion circuit 1 according to Embodiment 1. Therefore, it becomes possible to control variation in reference voltage and to raise conversion accuracy.

Here, in the capacitance DAC circuit 10 shown in FIG. 3, the second switch SW17 and SW18 were provided to the adjustment capacitor (for example, capacitors 37 and 38) formed in the second comparison wiring Wn side. However, the reference voltage to which this adjustment capacitor is given also in any of a sampling action and a comparison operation is fixed. Therefore, this adjustment capacitor can use in other packaging processes. The first modification and second modification are explained as the examples.

Figure 12:
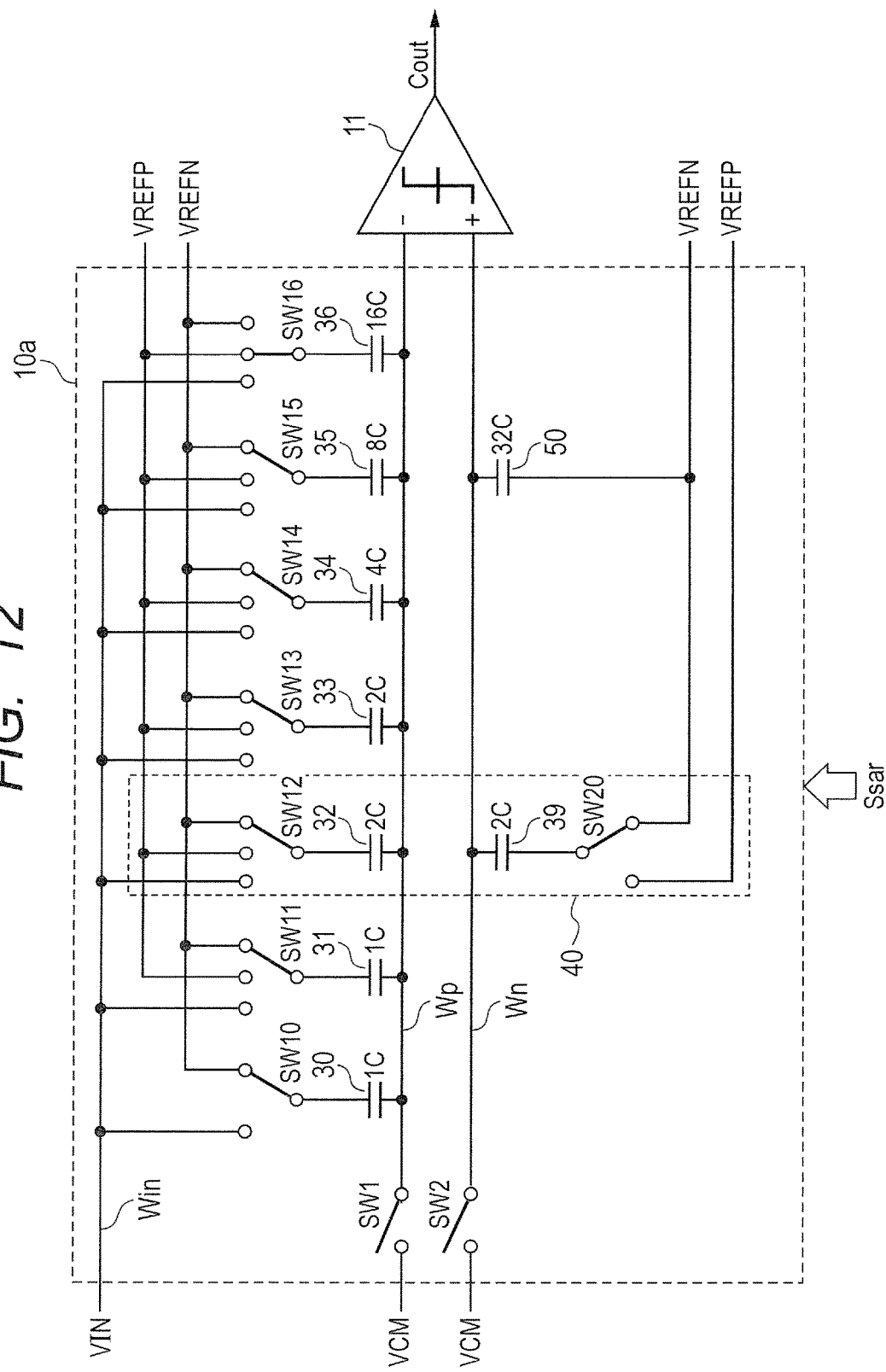
FIG. 12 is a circuit diagram explaining a first modification of the capacitance DAC circuit according to Embodiment 1.

The wiring diagram explaining the first modification of the capacitance DAC circuit according to Embodiment 1 is shown in FIG. 12. The capacitance DAC circuit 10a according to the first modification has a capacitor 50 between the wiring to which the low-potential side reference voltage VREFN is given, and the second comparison wiring Wn. This capacitor 50 has the capacitance value which totaled the capacitance values of capacitors 37 and 38. Since the capacitance value coupled to the second comparison wiring Wn also as such a circuit configuration is not different from the capacitance DAC circuit 10, it can realize the same analog-to-digital conversion circuit as the analog-to-digital conversion circuit 1 according to Embodiment 1 which adopted the capacitance DAC circuit 10.

Figure 13:
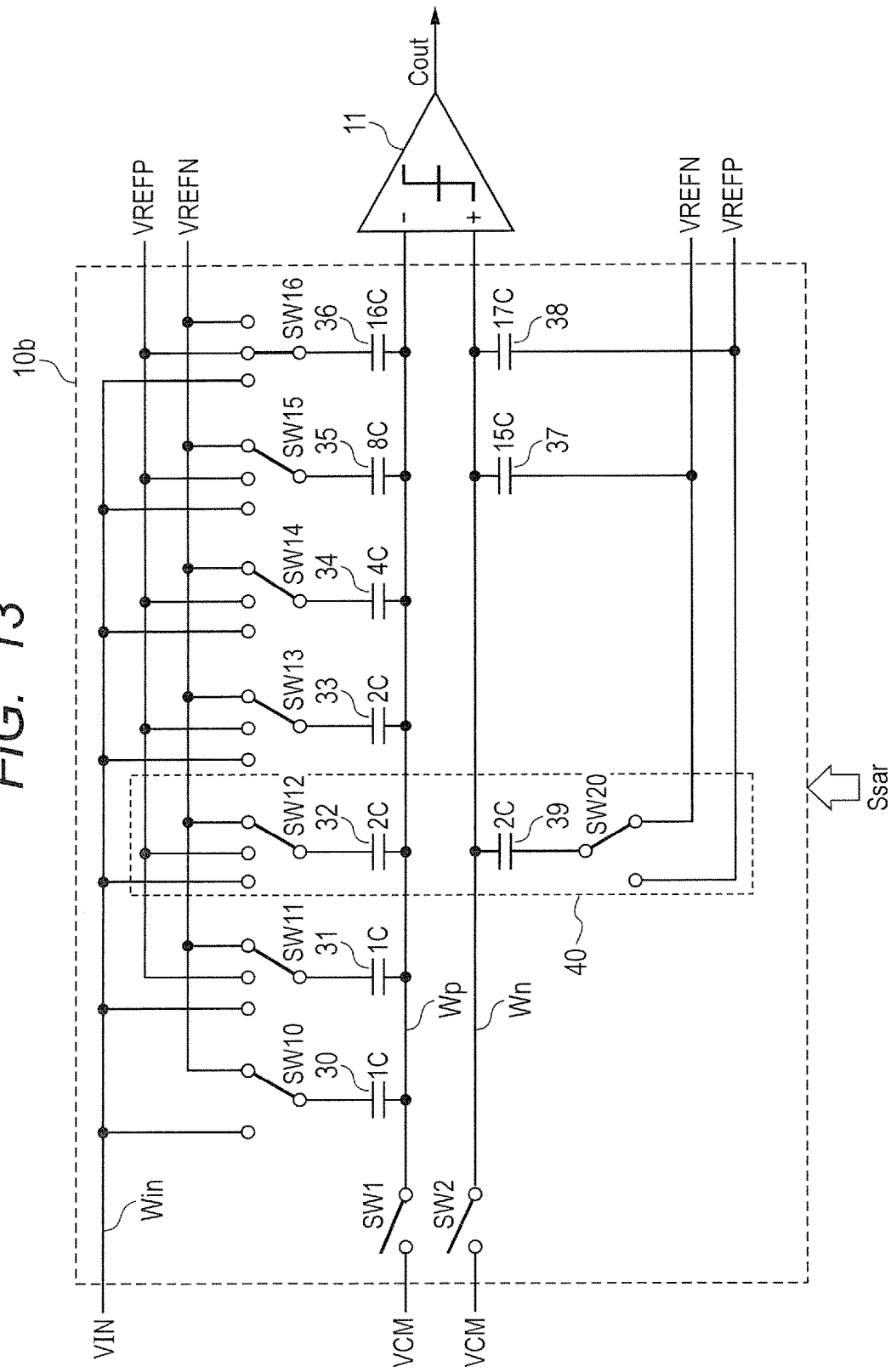
FIG. 13 is a circuit diagram explaining a second modification of the capacitance DAC circuit according to Embodiment 1.

A circuit diagram explaining a second modification of the capacitance DAC circuit according to Embodiment 1 is shown in FIG. 13. The capacitance DAC circuit 10b according to the first modification couples the capacitor 37 to the wiring to which the low-potential side reference voltage VREFN is given, without passing a switch, and couples the capacitor 38 to the wiring to which the high-potential side reference voltage VREFP is given, without passing a switch. Since the capacitance value coupled to the second comparison wiring Wn also as such a circuit configuration is not different from the capacitance DAC circuit 10, it can realize the same analog-to-digital conversion circuit as the analog-to-digital conversion circuit 1 according to Embodiment 1 which adopted the capacitance DAC circuit 10.

Moreover, the above explanation has described capacitors 30 to 39 as one capacitor, respectively. However, the capacitor may be of a type where, for example, unit capacitors having the same shape and the same capacitance values are arranged and there is made adjustment of the numbers of the unit capacitors each serving as one capacitor according to a wiring layout. By forming the capacitors 30 to 39 through the adjustment of the number of the unit capacitors to be combined, comparative accuracy among the capacitors can be raised.

The switches SW10 to SW19 and the switches SW1 to SW2 are comprised of transistors. The transistors used for the switches may form one transistor where two or more divided and laid out transistors are coupled in parallel.

Embodiment 2

Figure 14:
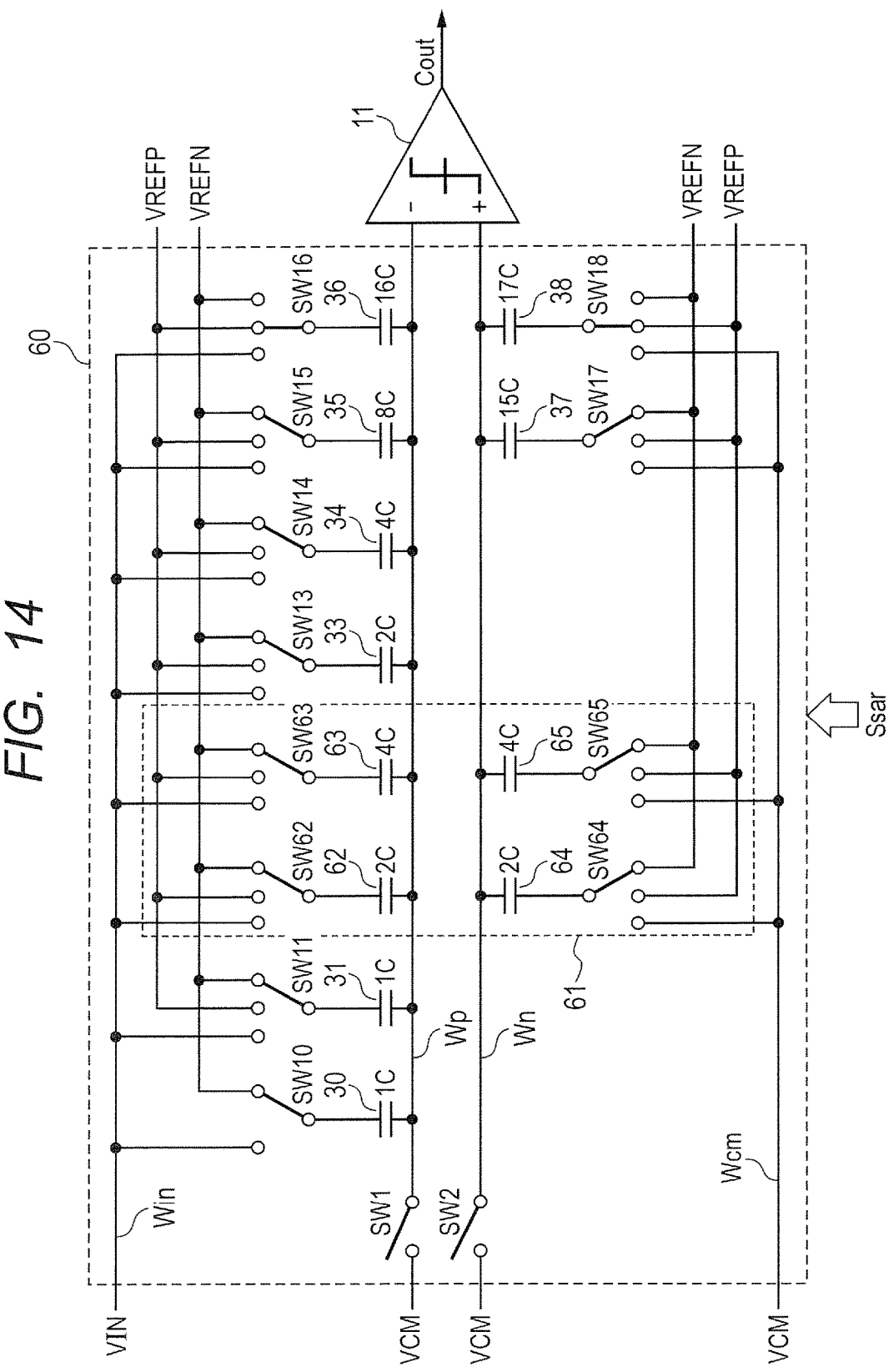
FIG. 14 is a circuit diagram showing a capacitance DAC circuit according to Embodiment 2.

In Embodiment 2, a capacitance DAC circuit 60 being another type of the capacitance DAC circuit 10 according to Embodiment 1 will be explained. FIG. 14 shows a circuit diagram of the capacitance DAC circuit 60 according to Embodiment 2. Also, in the description of Embodiment 2, the same reference characters express identical or equivalent elements and redundant description are omitted.

As shown in FIG. 14, in place of the redundant bit circuit 40 of the capacitance DAC circuit 10 according to Embodiment 1, the capacitance DAC circuit 60 according to Embodiment 2 includes a redundant bit circuit 61. The redundant bit circuit 61 includes: capacitors 62 to 65; first switches SW62 to SW63; and second switches SW64 to SW65.

The capacitor 62 is a redundancy bit capacitor having a capacitance value of 2C corresponding to a weight corresponding to a redundant bit of a conversion result. Moreover, the capacitor 62 has the same capacitance value as that of a capacitor 33 corresponding to a second bit of the conversion result. A first switch SW62 is provided at the other end of the capacitor 62. The first switch SW62 selects one of the input signal VIN, the high-potential side reference voltage VREFP, and the low-potential side reference voltage VREFN, and gives it to the other end of the capacitor 62.

The capacitor 63 is a redundant bit capacitor having a capacitance value of 4C corresponding to a weight corresponding to a redundant bit of the conversion result. Moreover, the capacitor 63 has the same capacitance value as that of a capacitor 34 corresponding to a third bit of the conversion result. A first switch SW63 is prepared at the other end of the capacitor 63. The first switch SW63 selects one of the input signal VIN, the high-potential side reference voltage VREFP, and the low-potential side reference voltage VREFN, and gives it to the other end of the capacitor 63.

The capacitor 64 is a redundant bit capacitor having a capacitance value of 2C corresponding to a weight corresponding to a redundant bit of the conversion result. Moreover, the capacitor 64 has the same capacitance value as that of the capacitor 33 corresponding to the second bit of the conversion result. A second switch SW64 is provided at the other end of the capacitor 64. The second switch SW64 selects one of a common voltage VCM, the high-potential side reference voltage VREFP, and the low-potential side reference voltage VREFN, and gives it to the other end of the capacitor 64.

The capacitor 65 is a redundant bit capacitor having a capacitance value of 4C corresponding to a weight corresponding to a redundant bit of the conversion result. Moreover, the capacitor 65 has the same capacitance value as that of the capacitor 34 corresponding to the third bit of the conversion result. A second switch SW65 is provided at the other end of the capacitor 65. The second switch SW65 selects one of the common voltage VCM, the high-potential side reference voltage VREFP, and the low-potential side reference voltage VREFN, and gives it to the other end of the capacitor 65.

That is, the analog-to-digital conversion circuit according to Embodiment 2 has, in its conversion result, a 2-bit redundant bit between LSB and the second bit. Further, the analog-to-digital conversion circuit according to Embodiment 2 has two redundant bits. Therefore, an operation of the analog-to-digital conversion circuit when it has two redundant bits will be explained below.

Figure 15:
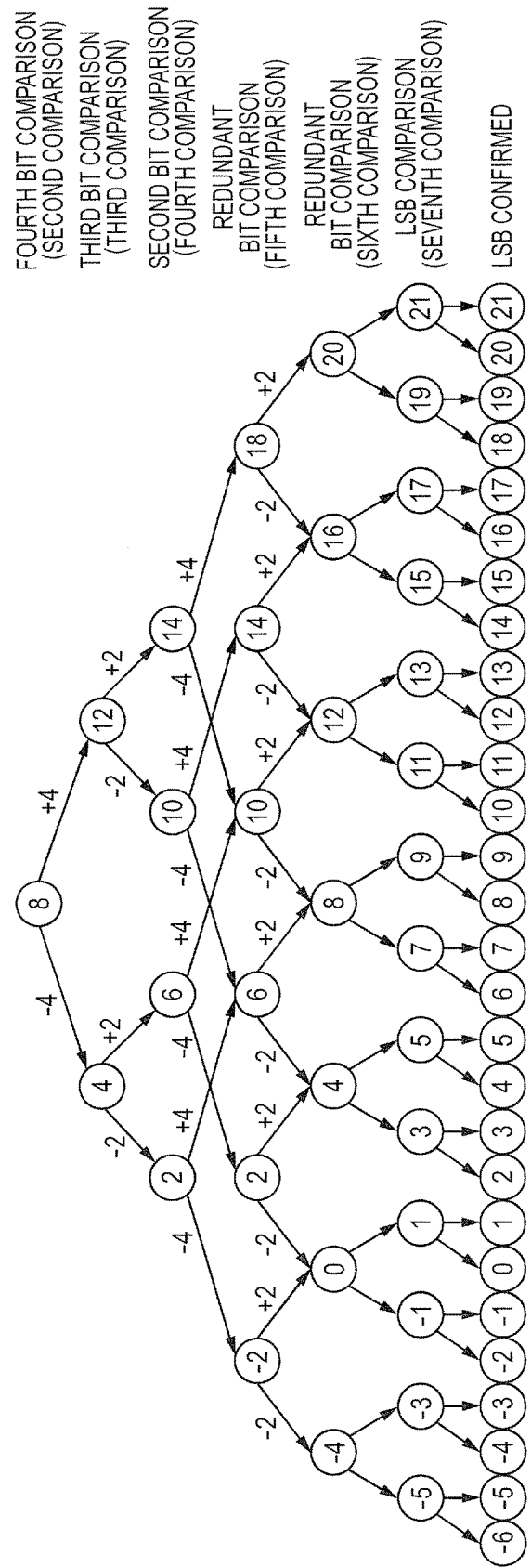
FIG. 15 is a diagram for explaining a binary search route in an analog-to-digital conversion circuit according to Embodiment 2.

FIG. 15 shows a diagram which explains a binary search rout in the analog-to-digital conversion circuit according to Embodiment 2. As shown in FIG. 15, the analog-to-digital conversion circuit according to Embodiment 2 has a redundant bit whose weight is set to 4C and a redundant bit whose weight is set to 2C. Therefore, a binary search rout more complicated than that of the analog-to-digital conversion circuit 1 according to Embodiment 1 can be formed in the analog-to-digital conversion circuit according to Embodiment 2.

Figure 16:
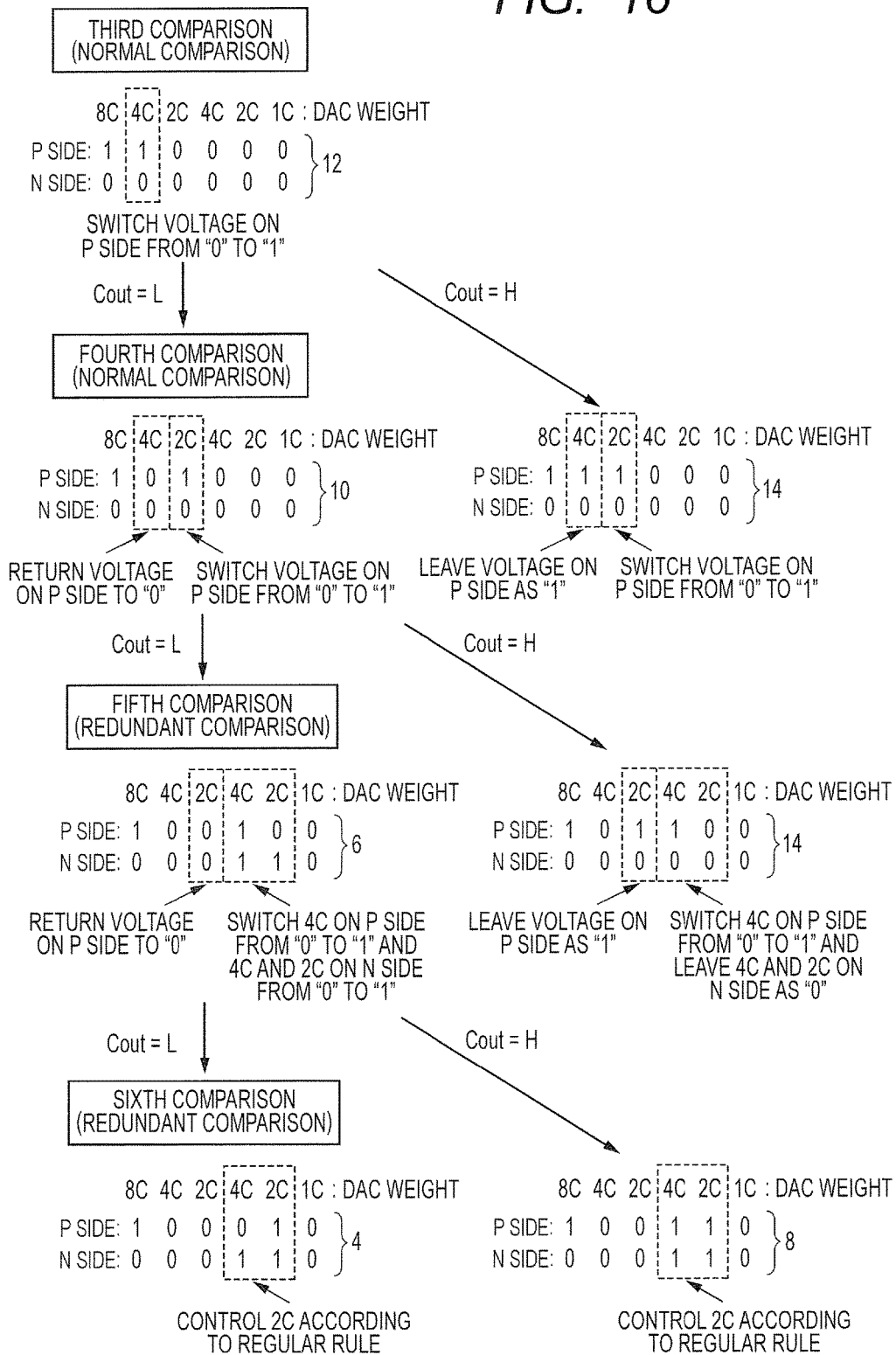
FIG. 16 is a diagram for explaining an example of controlling a redundant bit of the analog-to-digital conversion circuit according to Embodiment 2.

Next, switch control in the capacity DAC circuit 60 of the analog-to-digital conversion circuit according to Embodiment 2 will be explained. FIG. 16 shows a diagram which describes a control example of the redundant bit in the analog-to-digital conversion circuit according to Embodiment 2. FIG. 16 shows the control of a first switch and a second switch from a comparison operation of a third bit to a redundant comparison operation using the redundant bit. Moreover, in FIG. 16, "1" shows a state where a high-potential side reference voltage VREFP is selected by the first switch and the second switch and "0" shows a state where a low-potential side reference voltage VREFN is selected by the first switch and the second switch.

As shown in FIG. 16, operations of a third comparison where the comparison operation of the third bit and the fourth comparison where an operation of the second bit is performed are the same as an operation of the first switch arranged on the P side in the analog-to-digital conversion circuit 1 according to Embodiment 1 explained in FIG. 7. Therefore, an explanation thereof is omitted here. On the other hand, operations of a fifth comparison where a redundant comparison using the redundant bit as well as a sixth comparison differ in the analog-to-digital conversion circuit 1 according to Embodiment 1 and the analog-to-digital conversion circuit according to Embodiment 2. Therefore, the explanation thereof will be given below.

In the fifth comparison, a reference voltage selected by a first switch SW63 provided on the P side (for example, a first comparison wiring Wp side) corresponding to a capacitor 63 having a weight of 4C is switched from the low-potential side reference voltage VREFN to the high-potential side reference voltage VREFP. Moreover, in the fifth comparison where the redundant comparison is performed, a reference voltage selected by second switches SW64 and SW65 on an N side of the redundant bit circuit 61 (for example, a second comparison wiring Wn) is controlled. Specifically, when a comparison result Cout of the fourth comparison is at a low level, the reference voltage selected by the second switches SW64 and SW65 is switched from the low-potential side reference voltage VREFN to the high-potential side reference voltage VREFP. On the other hand, when the comparison result Cout of the fourth comparison is at a high level, the reference voltage selected by the second switches SW64 and SW65 is left as the low-potential side reference voltage VREFN.

Next, in a sixth comparison, based on a comparison result of the fifth comparison, a reference voltage to be selected by a first switch SW62 arranged on a P side (the first comparison wiring Wp side) is determined. Specifically, when a conversion result of the fifth comparison is at a low level, the reference voltage selected by the first switch SW62 is returned to the low-potential side reference voltage VREFN from the high-potential side reference voltage VREFP. On the other hand, when the conversion result of the fifth comparison is at a high level, the reference voltage selected by the first switch SW62 is left as the high-potential side reference voltage VREFP.

Moreover, in the sixth comparison, the reference voltage selected by the first switch SW62 on the P side (for example, the first comparison wiring Wp side) provided corresponding to a capacitor 62 having a weight of 2C is switched from the low-potential side reference voltage VREFN to the high-potential side reference voltage VREFP. Moreover, in the sixth comparison where the redundant comparison is performed, the reference voltage selected by the second switches SW64 and SW65 on the N side of the redundant-bit circuit 61 (for example, the second comparison wiring Wn) is left as the low-potential side reference voltage VREFN which is equivalent to that of the fifth comparison.

Thus, in the analog-to-digital conversion circuit according to Embodiment 2, as to a switch provided on a P side (a first comparison wiring Wp side) where sampling of an input signal is performed, a first switch corresponding to a bit to be compared is allowed to select the high-potential side reference voltage VREFP. Then, according to the conversion result, switching is made as to whether a reference voltage selected by the first switch corresponding to the bit to which the comparison operation is performed should be the high-potential side reference voltage VREFP or the low-potential side reference voltage VREFN. Moreover, about the second switch corresponding to a redundant bit, it is changed based on a comparison result which is obtained in a last normal comparison among normal comparison performed before the redundant comparison, it is switched whether the high-potential side reference voltage VREFP is chosen or the low-potential side reference voltage VREFN is chosen.

As described above, by having 2 bits of redundant bits in the analog-to-digital conversion circuit according to Embodiment 2, more search routes for reaching one final result can be formed than the analog-to-digital conversion circuit according to Embodiment 1. Thereby, the analog-to-digital conversion circuit according to Embodiment 2 has a correcting efficiency higher than the analog-to-digital conversion circuit according to Embodiment 1.

Moreover, also in the analog-to-digital conversion circuit according to Embodiment 2, the control of the redundant bit is performed based on a comparison result of a normal comparison operation performed before the redundant comparison and there is no case where a value of a higher-order bit than a redundant bit is changed. Therefore, an accelerating of a conversion rate and stabilization of a reference voltage are realizable, like the analog-to-digital conversion circuit 1 according to Embodiment 1, also in the analog-to-digital conversion circuit according to Embodiment 2.

Embodiment 3

Figure 17:
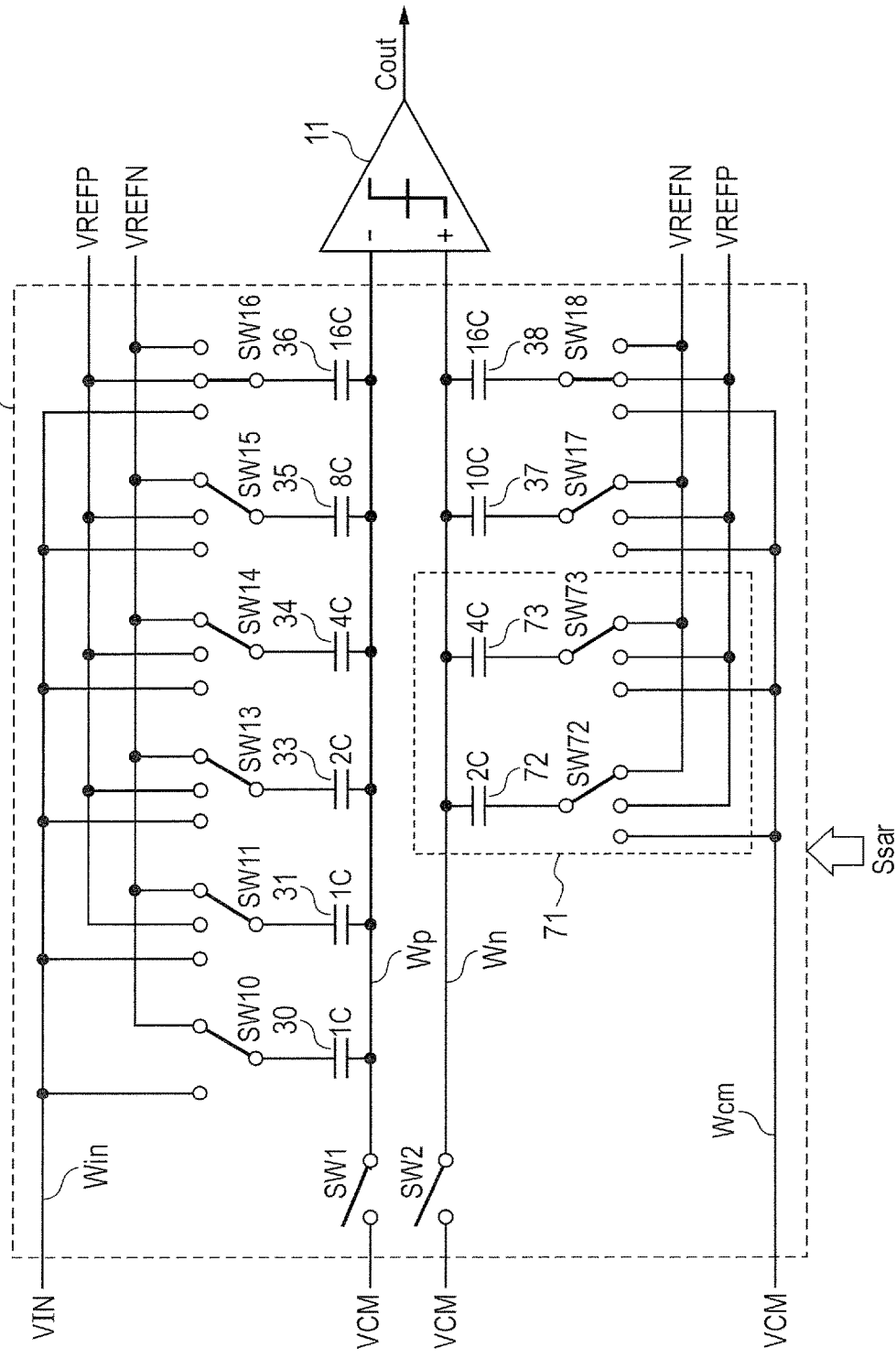
FIG. 17 is a circuit diagram showing a capacitance DAC circuit according to Embodiment 3.

In Embodiment 3, there is explained a capacity DAC circuit 70 used as another type of the capacity DAC circuit 10 according to Embodiment 1. The circuit diagram of the capacity DAC circuit 70 according to Embodiment 3 is shown in FIG. 17. In addition, in an explanation of the regime 3 of an implementation, the same coding scheme as the regime 1 of an implementation and the regime 1 of the implementation about the same entity is attached, and an explanation is omitted.

As shown in FIG. 17, in the capacitance DAC circuit 70 according to Embodiment 3, there are removed the capacitor 32 and the first switch SW12 corresponding to the redundant bit arranged on the first comparison wiring Wp side of the capacitance DAC circuit 10 according to Embodiment 1. Moreover, the capacitance DAC circuit 70 according to Embodiment 3 includes, in replaced of the redundant-bit circuit 40 of the capacitance DAC circuit 10 according to Embodiment 1, a redundant bit circuit 71. The redundant bit circuit 61 has capacitors 62 to 65, first switches SW62 to SW63, and second switches SW64 to SW65. In addition, in the capacitance DAC circuit 70 according to Embodiment 3, there is less total capacitance of the capacitor formed on the first comparison wiring Wp side by 2 C than that of the capacitance DAC10 according to Embodiment 1. Moreover, in the capacitance DAC circuit 70 according to Embodiment 3, there is less total capacitance of the capacitor formed on the second comparison wiring Wn side by 2 C than capacitance DAC10 according to Embodiment 1. Therefore, the sum of the capacitance values of the capacitors 37 and 38 have become smaller than capacitance DAC10 according to Embodiment 1.

A capacitor 72 is a redundant bit capacitor which has a capacitance value of 2C corresponding to the weight corresponding to the redundant bit of a conversion result. Moreover, the capacitor 72 has the same capacitance value as that of the capacitor 33 corresponding to the second bit of a conversion result. The second switch SW72 is provided at the other end of the capacitor 72. The second switch SW72 selects and gives the common voltage VCM, the high-potential side reference voltage VREFP, or the low-potential side reference voltage VREFN, and gives it to the other end of the capacitor 72.

The capacitor 73 is a redundant bit capacitor which has a capacitance value of 4C corresponding to the weight corresponding to the redundant bit of a conversion result. Moreover, the capacitor 73 has the same capacitance value as that of the capacitor 34 corresponding to the third bit of the conversion result. A second switch SW73 is provided at the other end of the capacitor 73. The second switch SW73 selects one of the common voltage VCM, the high-potential side reference voltage VREFP, and the low-potential side reference voltage VREFN, and gives it to the other end of the capacitor 73.

That is, the analog-to-digital conversion circuit according to Embodiment 3 has a 2-bit redundant bit between LSB and the second bit in the conversion result. Also, the analog-to-digital conversion circuit according to Embodiment 3 has redundant-bit capacitors whose weights are different. However, in the analog-to-digital-conversion circuit according to Embodiment 3, a 1-bit redundant bit is formed by using two redundant-bit capacitors. Therefore, an operation of the analog-to-digital conversion circuit according to Embodiment 3 will be explained below.

Figure 18:
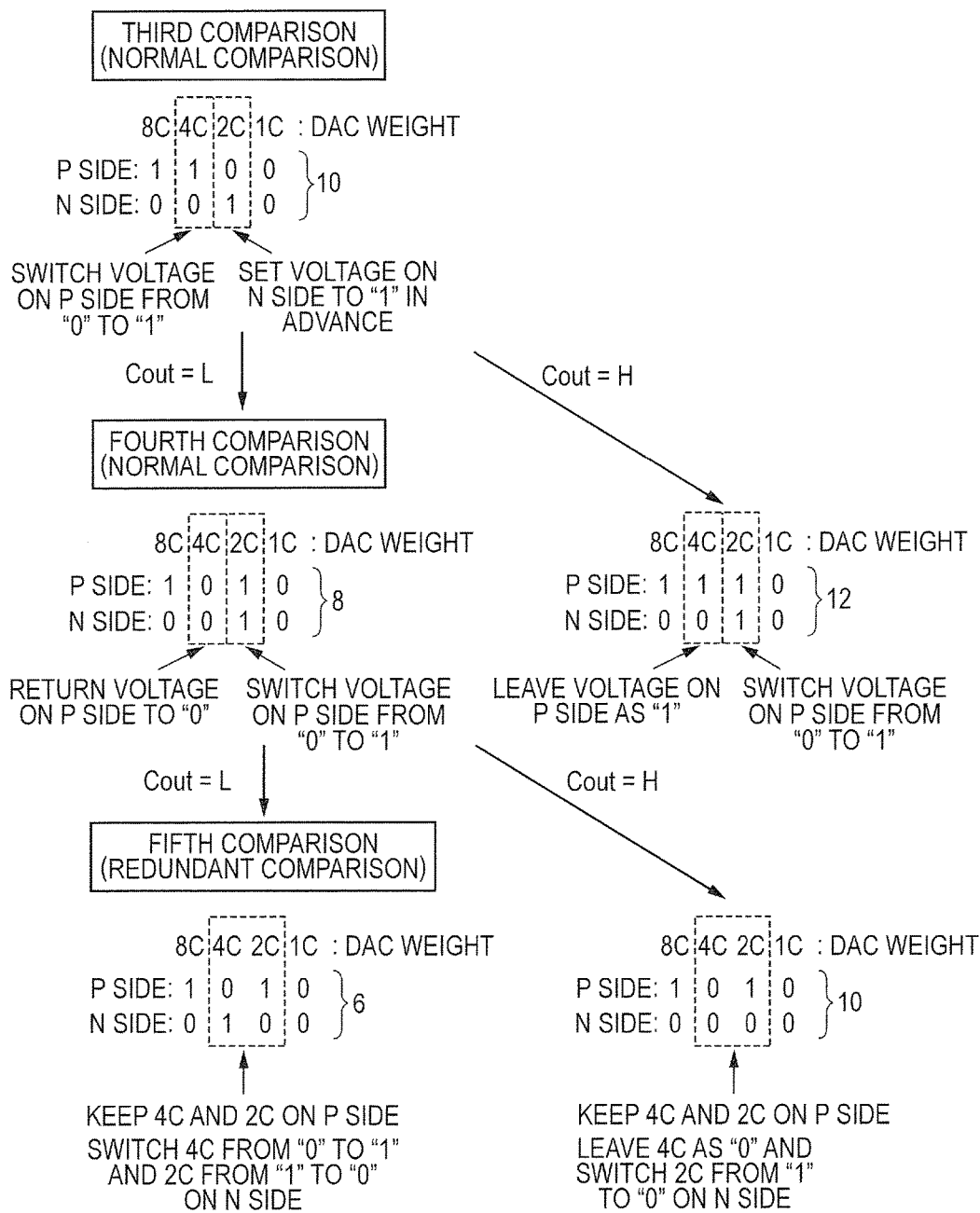
FIG. 18 shows a diagram for explaining a control example of a redundant bit of the analog-to-digital conversion circuit according to Embodiment 3.

Now, there will be explained a switch control in a capacitance DAC circuit 70 of the analog-to-digital conversion circuit according to Embodiment 3. In this regard, FIG. 18 explains the example of a control of the redundant bit of the analog-to-digital conversion circuit according to Embodiment 3. FIG. 18 shows the control of a first switch and a second switch from a comparison operation in a third bit to a redundant comparison operation which uses a redundant bit. Moreover, in FIG. 18, "1" indicates a state where the high-potential side reference voltage VREFT is selected by the first switch and the second switch and "0" indicates a state where a low-potential side reference voltage VREFN is selected by the first switch and the second switch.

As shown in FIG. 18, in the analog-to-digital conversion circuit according to Embodiment 3, the comparison operation is started such that the high-potential side reference voltage VREFP is selected by a second switch SW72 to be coupled to a capacitor 72, among capacitors 72 and 73 serving as redundant bit capacitors when starting the conversion operation, whose weight to be related.

Then, in a third comparison where the comparison operation of the third bit is performed, a reference voltage selected by a first switch SW14 on a P side of third bit (for example, a first comparison wiring Wp side) is switched from the low-potential side reference voltage VREFN to the high-potential side reference voltage VREFP. In the third comparison, the comparison operation is performed in this state. When a comparison result Cout is at a low level, a reference voltage selected by a first switch SW14 in a fourth comparison where a comparison operation of a second bit is performed is returned to the low-potential side reference voltage VREFN from the high-potential side reference voltage VREFP. On the other hand, when the comparison result Cout of the third comparison is at a high level, the reference voltage selected by the first switch SW14 in the fourth comparison where the comparison operation of the second bit is left as the high-potential side reference voltage VREFP.

Next, in the fourth comparison, a reference voltage selected by a first switch SW13 on a P side of the second bit (for example, the first comparison wiring Wp side) is switched from the low-potential side reference voltage VREFN to the high-potential side reference voltage VREFP. In the fourth comparison, the comparison operation is performed in this state. Then, when a comparison result Cout of the fourth comparison is a low level, a reference voltage selected by a second switch SW73 in a fifth comparison where a comparison operation of a redundant bit is performed is switched from the low-potential side reference voltage VREFN to the high-potential side reference voltage VREFP. On the other hand, when the comparison result Cout of the fourth comparison is at a high level, a reference voltage selected by the second switch SW73 in the fifth comparison where the comparison operation of the redundant bit is performed is left as the low-potential side reference voltage VREFN. Moreover, in the fifth comparison, regardless of the comparison result Cout of the fourth comparison being at the low level or the high level, a reference voltage selected by a second switch SW72 is switched from the high-potential side reference voltage VREFP to the low-potential side reference voltage VREFN.

Thus, also in the analog-to-digital conversion circuit according to Embodiment 3, based on a comparison result obtained in the most previous comparison operation, the second switch corresponding to the redundant bit is switched whether to select the high potential side reference voltage VREFP or to select the low potential side reference voltage VREFN.

As described above, in the analog-to-digital conversion circuit according to Embodiment 3, the same redundant comparison operation as that of the analog-to-digital conversion circuit according to Embodiment 1 can be performed by including redundant bit capacitors whose weights are different and by switching the reference voltage to be given to the redundant-bit capacitor based on a previous conversion result. That is, also in the analog-to-digital conversion circuit according Embodiment 3, the control of the redundant bit is performed based on a comparison result of a normal comparison operation performed before the redundant comparison, and the value of the higher-order bit than the redundant bit will not be changed. Therefore, also in the analog-to-digital conversion circuit according to Embodiment 3, faster conversion speed and stabilization of the reference voltage are realizable as in the analog-to-digital conversion circuit 1 according to Embodiment 1.

Moreover, in the analog-to-digital conversion circuit according to Embodiment 3, the sum of the capacitance values of the capacitors used for the capacity DAC circuit 70 is smaller than the capacitance value of the capacity DAC circuit 10 of the analog-to-digital conversion circuit 1 according to Embodiment 1. To be specific, therefore, in the analog-to-digital conversion circuit according to Embodiment 3, the sum of the capacitance values of the capacitors used for the capacity DAC circuit 70 according to Embodiment 2 is smaller than that of the capacitors used for the capacitance DAC circuit 10 by 4 C. Capacitors are elements which occupy a large area over a semiconductor chip, and by reducing the sum of the capacitance values of the capacitors, the area of the semiconductor chip can be greatly reduced.

Embodiment 4

Figure 19:
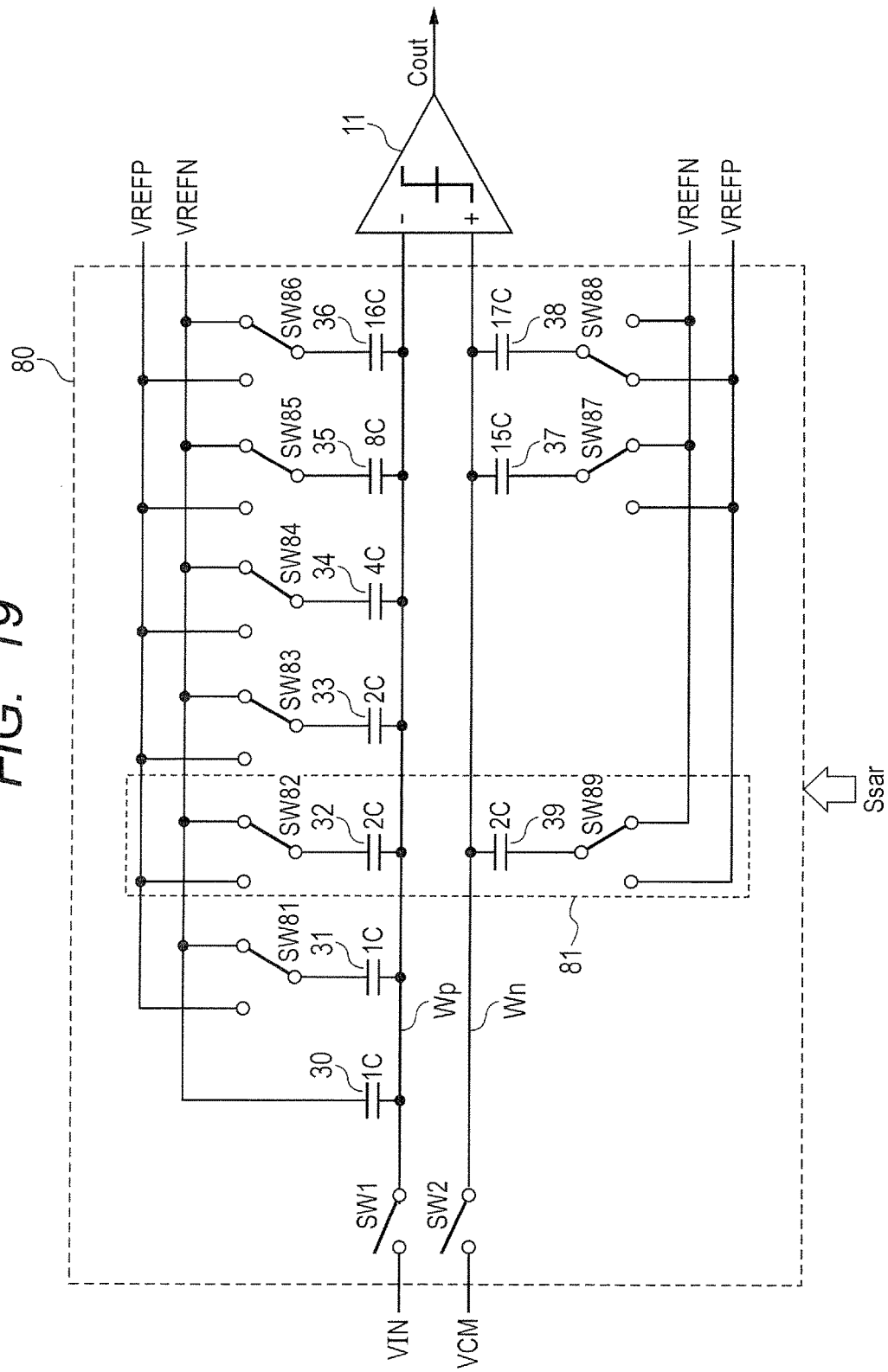
FIG. 19 is a circuit diagram of a capacitance DAC circuit according to Embodiment 4.

Embodiment 4 explains the capacitance DAC circuit 80 used as another form of the capacitance DAC circuit 10 according to Embodiment 1. Therefore, the wiring diagram of the capacitance DAC circuit 90 according to Embodiment 4 is shown in FIG. 19. In addition, in an explanation of Embodiment 4, the same constituent elements as Embodiment 1 are attached with the same reference characters as Embodiment 1, and an explanation is omitted.

With regard to the capacitance DAC circuit explained in Embodiments 1 to 3, there has been described the bottom plate sampling type analog-to-digital conversion circuit which inputs an input signal from the near terminal into which the high-potential side reference voltage VREFP or the low potential side reference voltage VREFN is inputted among the terminals of the capacitors 31 to 36 which determine the weight to the bits for conversion. On the other hand, the analog-to-digital conversion circuit according to Embodiment 4 is a top plate sampling type analog-to-digital conversion circuit which inputs an input signal from the near terminal coupled to a first comparison wiring Wp of the terminals of capacitors 31 to 36. In addition, FIG. 19 shows the redundant bit circuit 81 as a circuit corresponding to the redundant bit circuit 40. The switches in the redundant bit circuit 81 include the first switch SW82 and a second switch SW89.

In the capacitance DAC circuit 80 according to Embodiment 4, as shown in FIG. 19, the inputting wiring Win and the common voltage wiring Wcm of the capacitance DAC circuit 10 according to Embodiment 1 are deleted, and the first switches SW11 to SW16 and second switches SW17 to SW19 are replaced with the first switches SW81 to SW86 and second switches SW87 to SW89. Moreover, in the capacitance DAC circuit 80 according to Embodiment 4, the input signal VIN is given to the first comparison wiring Wp through a sampling switch (for example, switch SW1).

The first switches SW81 to SW86 and second switches SW87 to SW89 select either of the high potential side reference voltage VREFP and the low-potential side reference voltage VREFP, and give it accordingly.

In this regard, also in the analog-to-digital conversion circuit according to Embodiment 4, the switch control of the capacitance DAC circuit 80 differs from that of the analogto-digital conversion circuit in that the input signal VIN is inputted from the first comparison wiring Wp side when sampling the input signal VIN. However, when applying comparison processing to the sampled input signal VIN, to the switch control method of the analog-to-digital conversion circuit of Embodiment 4, the same method as that of Embodiment 1 can be adopted.

As described above, in the analog-to-digital conversion circuit according to Embodiment 4, in the analog-to-digital conversion circuit of the top-plate sampling type also, the capacitor determining the weight included in the capacitance DAC circuit 80 and the configuration of the switch applying the reference voltage to the capacitor are the same as those of the capacitance DAC circuit 10. Thus, also in the analog-to-digital conversion circuit according to Embodiment 4, as in the analog-to-digital conversion circuit 1 according to Embodiment 1, higher-speed conversion and stabilization of the referable voltage can be achieved.

Although the invention made above by the present inventors has been described specifically on the basis of the embodiments, the present invention is not limited to the embodiments referred to above. It is needless to say that various changes can be made thereto within the scope not departing from the gist thereof.

What is claimed is:

1. A semiconductor device, comprising:
a comparator which switches a logic level of an output signal based on a relative size relationship between voltage levels inputted to first and second input terminals of the comparator;
a first comparison wiring coupled with the first input terminal of the comparator;
a second comparison wiring coupled with the second input terminal of the comparator;
an input wiring to which an input signal is transmitted;
a plurality of first capacitors which sample the input signal when starting conversion processing, each first capacitor having one end coupled with the first comparison wiring, and a capacitance value corresponding to a weight of a bit to be converted;
a plurality of first switches, each first switch of the plurality of first switches being provided to a corresponding one of the plurality of first capacitors, and each first switch being configured to select one of the input signal, a first reference voltage, and a second reference voltage to be supplied to the other end of the corresponding first capacitor;
a plurality of second capacitors, each second capacitor having one end coupled with the second comparison wiring, wherein the sum of capacitance values of the plurality of second capacitors is equivalent to the sum of the capacitance values of the plurality of first capacitors, each second capacitor of the plurality of second capacitors sample one of the first reference voltage and the second reference voltage when starting conversion processing, the plurality of second capacitors including a redundant bit capacitor and an adjustment capacitor; and
a second switch which is provided to the redundant bit capacitor, and which selects one of a common voltage, the first reference voltage, and the second reference voltage to be supplied to the other end of the redundant bit capacitor,
wherein
the redundant bit capacitor comprises a capacitance value corresponding to a weight of a redundant bit,
wherein the adjustment capacitor comprises a capacitance value obtained by subtracting the capacitance value of the redundant bit capacitor from the sum of the capacitance values of the first capacitors,
wherein the first comparison wiring is supplied with the common voltage through a first common voltage supply changeover switch, and
wherein the second comparison wiring is supplied with the common voltage through a second common voltage supply changeover switch.

2. The semiconductor device according to claim 1, wherein the first capacitors include two capacitors, each having a capacitance value corresponding to the weight of the redundant bit.

3. The semiconductor device according to claim 1, wherein the redundant bit capacitor includes capacitors having capacitance values corresponding to different weights.

4. The semiconductor device according to claim 1, wherein the adjustment capacitor includes:
a first adjustment capacitor having a capacitance value obtained by dividing the sum of the capacitance values of the second capacitors into two; and
a second adjustment capacitor having a capacitance value obtained by subtracting the sum of the capacitance value of the first adjustment capacitor and the capacitance value of the redundant bit capacitor from the sum of the capacitance values of the second capacitors,
wherein the other end of the first adjustment capacitor is selectively coupled to the first reference voltage, the second reference voltage, and the common voltage through a third switch, and
wherein the other end of the second adjustment capacitor is selectively coupled to the first reference voltage, the second reference voltage, and the common voltage through a fourth switch.

5. The semiconductor device according to claim 1, wherein the other end of the adjustment capacitor is selectively coupled to the first reference voltage, the second reference voltage, and the common voltage through a third switch.

6. The semiconductor device according to claim 1, wherein the other end of the adjustment capacitor is coupled to a fixed voltage wiring which is fixed to a predetermined voltage.

7. The semiconductor device according to claim 1, wherein, throughout a conversion processing period, the other end of the adjustment capacitor is supplied with one of the first reference voltage and the second reference voltage.

8. The semiconductor device according to claim 4, wherein, throughout a conversion processing period, the other end of the first adjustment capacitor is supplied with the first reference voltage, and the other end of the second adjustment capacitor is supplied with the second reference voltage.

9. The semiconductor device according to claim 1, wherein the capacitance value of the redundant bit capacitor is that of one of the first capacitors.

10. The semiconductor device according to claim 1, wherein, during a sampling period, each of the first capacitors is supplied with the input signal through an associated one of the first switches, and each of the second capacitors is supplied with at least one of the first reference voltage and the second reference voltage.

11. An analog-to-digital converter comprising:
a comparator having a first and a second input terminal and comparing a first input voltage input to the first input terminal with a second input voltage input to the second input terminal;
a first comparison wiring coupled between the first input terminal of the comparator and a first common voltage switch, the first comparison wiring supplied with a common voltage through the first common voltage switch;
a second comparison wiring coupled between the second input terminal of the comparator and a second common voltage switch, the second comparison wiring supplied with the common voltage through the second common voltage switch;
a plurality of first capacitors, each of the first capacitors having a first end connected to the first comparison wiring and a second end selectively connected to a first reference voltage, a second reference voltage and an input voltage through an associated one of a plurality of first switches;
a first redundant bit capacitor connected between the first comparison wiring and a second switch, and being selectively connected to the first reference voltage, the second reference voltage, and the input voltage through the second switch;
a second redundant bit capacitor connected between the second comparison wiring and a third switch, and being selectively connected to the first reference voltage, the second reference voltage and the common voltage through the third switch; and
an adjustment capacitor having an adjustment capacitance value obtained by summing up the capacitance values of the first capacitors, and being connected between the second comparison wiring and a fourth switch, and being selectively connected to the first reference voltage, the second reference voltage and the common voltage through the fourth switch,
wherein the first redundant bit capacitor and the second redundant bit capacitor have same capacitance values as one of the plurality of first capacitors.

12. The analog-to-digital converter according to claim 11, wherein, in a conversion processing period, the second redundant bit capacitor is supplied with one of the first reference voltage and the second reference voltage based on a comparison result of a comparison operation corresponding to the one first capacitor that has the same capacitance value as the second redundant bit capacitor.

* * * * *